(12) United States Patent
Xu et al.

(10) Patent No.: US 9,166,022 B2
(45) Date of Patent: Oct. 20, 2015

(54) FIN-LIKE FIELD EFFECT TRANSISTOR (FINFET) DEVICE AND METHOD OF MANUFACTURING SAME

(75) Inventors: Jeff J. Xu, Jhubei (TW); Chih-Hao Chang, Chu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 753 days.

(21) Appl. No.: 12/917,902

(22) Filed: Nov. 2, 2010

(65) Prior Publication Data

US 2012/0104472 A1    May 3, 2012

(51) Int. Cl.
*H01L 21/336* (2006.01)
*H01L 29/66* (2006.01)
*H01L 29/78* (2006.01)

(52) U.S. Cl.
CPC ........ *H01L 29/66795* (2013.01); *H01L 29/785* (2013.01); *H01L 29/7848* (2013.01)

(58) Field of Classification Search
USPC .......... 257/329, 401, 623, E29.022, E29.262, 257/E21.409
IPC ................................ H01L 21/823821,29/66795
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0101978 A1* | 4/2009 | Anderson et al. ............. 257/365 |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Marcos D Pizarro
(74) *Attorney, Agent, or Firm* — Haynes and Boone, LLP

(57) ABSTRACT

A FinFET device and method for fabricating a FinFET device is disclosed. An exemplary method includes providing a semiconductor substrate; forming a first fin structure and a second fin structure over the semiconductor substrate; forming a gate structure over a portion of the first and second fin structures, such that the gate structure traverses the first and second fin structures; epitaxially growing a first semiconductor material on exposed portions of the first and second fin structures, such that the exposed portions of the first and second fin structures are merged together; and epitaxially growing a second semiconductor material over the first semiconductor material.

20 Claims, 32 Drawing Sheets

(56) References Cited

U.S. PATENT DOCUMENTS

| | | | |
|---|---|---|---|
| 2009/0181477 A1* | 7/2009 | King et al. | 438/17 |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0183961 A1 | 7/2010 | Shieh et al. | |
| 2010/0203734 A1 | 8/2010 | Shieh et al. | |
| 2010/0264468 A1 | 10/2010 | Xu | |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U. S. Patent Application No. 12/953,148, "Device and Method for Forming Fins in Integrated Circuitry," filed Nov. 23, 2010, 39 pages.

Unpublished U.S. Appl. No. 12/906,820, filed Oct. 18, 2010 entitled, Fin-Like Field Effect Transistor (FINFET) Device and Method of Manufacturing Same, 55 pages.

* cited by examiner

000
FIN-LIKE FIELD EFFECT TRANSISTOR (FINFET) DEVICE AND METHOD OF MANUFACTURING SAME

CROSS-REFERENCE TO RELATED APPLICATIONS

The present disclosure is related to commonly-assigned U.S. patent application entitled Fin-Like Field Effect Transistor (FinFET) Device and Method of Manufacturing Same Ser. No. 12/906,820, filed Oct. 18, 2010, the entire disclosure of which is incorporated herein by reference.

BACKGROUND

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A typical FinFET is fabricated with a thin "fin" (or fin structure) extending from a substrate, for example, etched into a silicon layer of the substrate. The channel of the FinFET is formed in the vertical fin. A gate is provided over (e.g., wrapping) the fin. It is beneficial to have a gate on both sides of the channel allowing gate control of the channel from both sides. FinFET devices also include strained source/drain features to enhance carrier mobility and improve device performance. The strained source/drain features typically use epitaxial (epi) silicon germanium (SiGe) in p-type devices and epi silicon (Si) in n-type devices. FinFET devices provide numerous advantages, including reduced short channel effects and increased current flow. Although existing FinFET devices and methods for fabricating FinFET devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
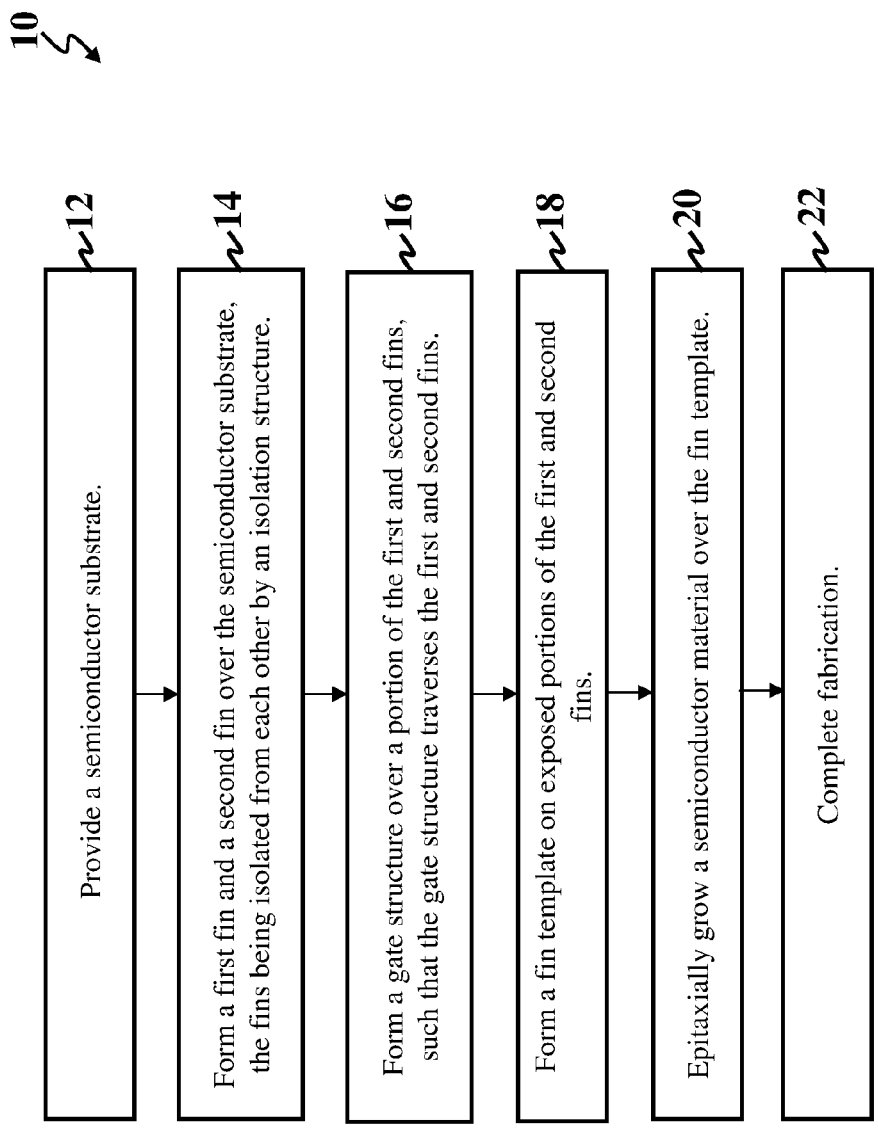
FIG. 1 is a flow chart of a method for fabricating a fin-like field effect transistor (FinFET) device according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 10 for fabricating an integrated circuit device according to various aspects of the present disclosure. In the depicted embodiment, the method 10 fabricates an integrated circuit device that includes a fin-like field effect transistor (FinFET) device. The method 10 begins at block 12 where a semiconductor substrate is provided. At block 14, a first fin and a second fin are formed over the semiconductor substrate. An isolation structure is formed to isolate the first and second fins. At block 16, a gate structure is formed over a portion of the first and second fins. The gate structure traverses the first and second fins. At block 18, a fin template is formed on exposed portions of the first and second fins. At block 20, a semiconductor material is epitaxially grown over the fin template. The method 10 continues with block 22 where fabrication of the integrated circuit device is completed. Additional steps can be provided before, during, and after the method 10, and some of the steps described can be replaced or eliminated for other embodiments of the method. The discussion that follows illustrates various embodiments of an integrated circuit device that can be fabricated according to the method 10 of FIG. 1.

FIGS. 2-6 provide various perspective views of a FinFET device 100, in portion or entirety, at various stages of fabrication according to the method 10 of FIG. 1. The term FinFET device refers to any fin-based transistor, such as a fin-based, multi-gate transistor. The FinFET device 100 may be included in a microprocessor, memory cell, and/or other integrated circuit device. FIGS. 2-6 have been simplified for the sake of clarity to better understand the inventive concepts of the present disclosure. Additional features can be added in the FinFET device 100, and some of the features described below can be replaced or eliminated in other embodiments of the FinFET device 100.

Figure 2:
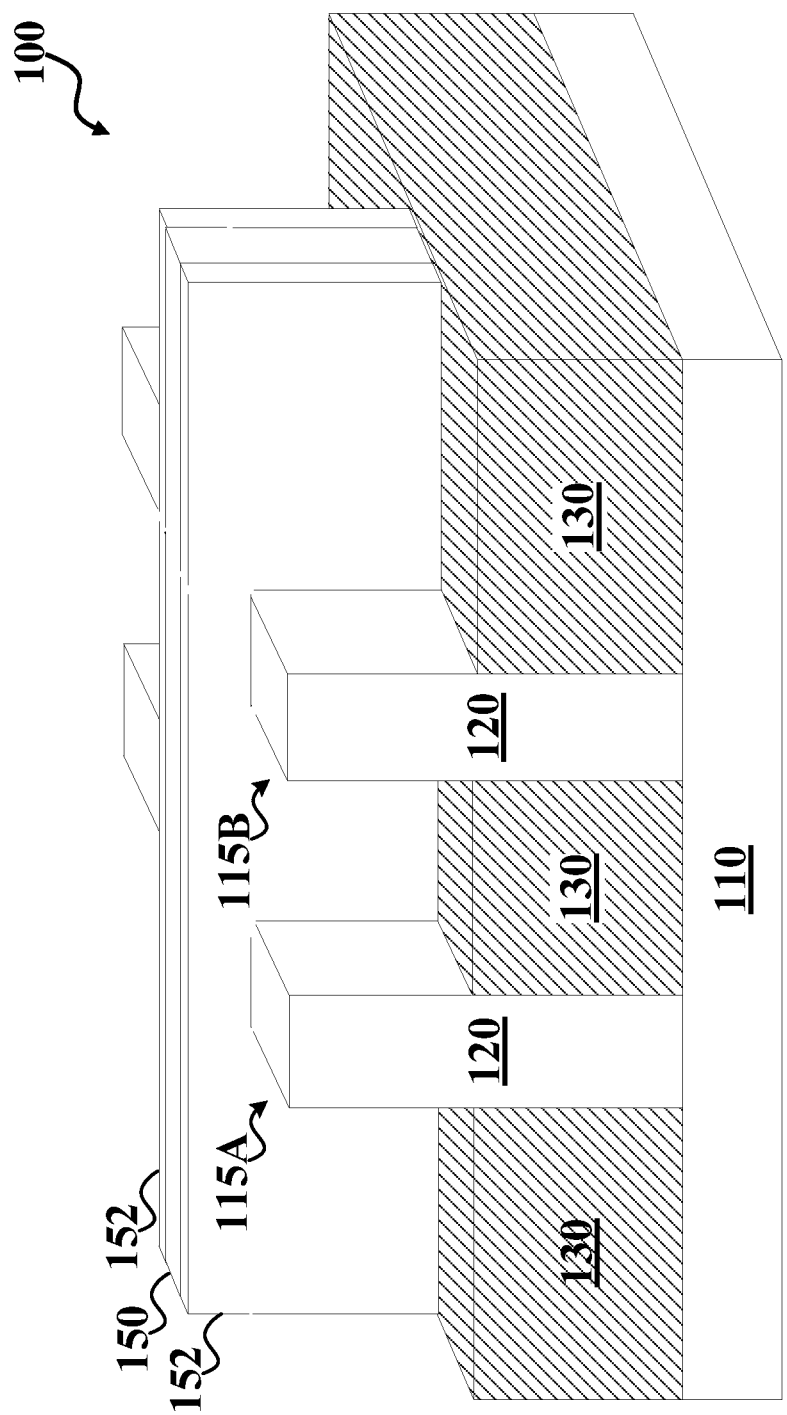
FIGS. 2-6 are perspective views of a FinFET device at various fabrication stages according to the method of FIG. 1.

Referring to FIG. 2, the FinFET device 100 includes a substrate (wafer) 110. In the depicted embodiment, the substrate 110 is a bulk silicon substrate. Alternatively or additionally, the substrate 110 includes an elementary semiconductor, such as silicon or germanium in a crystalline structure;

a compound semiconductor, such as silicon carbide, gallium arsenic, gallium phosphide, indium phosphide, indium arsenide, and/or indium antimonide; or combinations thereof. Alternatively, the substrate 110 is a silicon-on-insulator (SOI) substrate. The SOI substrate can be fabricated using separation by implantation of oxygen (SIMOX), wafer bonding, and/or other suitable methods. The substrate 110 may include various doped regions and other suitable features.

The FinFET device 100 includes fin structure 115A and 115B that extend from the substrate 110. In the depicted embodiment, the fin structures 115A and 115B include fins 120. The fins 120 include silicon (Si), and accordingly, may also be referred to as Si fins. The fin structures 115A and 115B may include other material portions. The fins 120 include a source region, a drain region, and a channel defined between the source and drain regions. The fins 120 are formed by implementing a lithography and etching process. For example, beginning with the substrate 110, a lithography and etching process forms trenches in the substrate 110, thereby forming fins 120, which extend from the substrate 110. The lithography process may include photoresist coating (e.g., spin-on coating), soft baking, mask aligning, exposure, post-exposure baking, developing the photoresist, rinsing, drying (e.g., hard baking), other suitable processes, or combinations thereof. For example, the fin portions 120 may be formed by forming a photoresist layer (resist) overlying the substrate 110, exposing the resist to a pattern, performing a post-exposure bake process, and developing the resist to form a masking element including the resist. The masking element may then be used to etch the fins 120 into the silicon substrate 110. The etching process may be a dry etching process, wet etching process, other suitable etching process, or combinations thereof. For example, the fins 120 may be etched into the substrate 110 using a reactive ion etch (RIE). Alternatively, the lithography process could be implemented or replaced by other methods, such as maskless photolithography, electron-beam writing, ion-beam writing, and/or nanoimprint technology. The fins 120 may be formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes. It is noted that the term "fin structure" in the depicted embodiment refers to individual fins of the FinFET device 100. However, the term "fin structure" may also refer to the fins collectively, and thus, fin structure may also refer to fin structures 115A and 115B collectively. Further, though the depicted embodiment illustrates two fins, the FinFET device 100 may include fewer or more fins depending on design requirements of the FinFET device 100.

Isolation features 130, such as shallow trench isolation (STI) structures, surround the fin structures 115A and 115B (in the depicted embodiment, the fins 120), isolating the fins 120 from each other and other not-illustrated integrated circuit devices. The isolation features 130 may be formed by partially filling trenches surrounding the fins 120 with an insulating material, such as silicon oxide, silicon nitride, silicon oxynitride, other suitable material, or combinations thereof. The filled trench may have a multi-layer structure, for example, a thermal oxide liner layer with silicon nitride filling the trench. In the depicted embodiment, the isolation features 130 include an oxide material.

The FinFET device 100 includes a gate structure 150. The gate structure 150 traverses the fins 120, and in the depicted embodiment, is formed on a central portion of the fins 120. The gate structure 150 may include a gate dielectric layer and a gate electrode. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 150, such as the gate electrode, may be formed in a gate first or gate last process. The gate structure 150 may include numerous other layers, for example, capping layers, interface layers, diffusion layers, barrier layers, hard mask layers, or combinations thereof.

The gate structure 150 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, or ion-beam writing. In yet another alternative, the lithography patterning process could implement nanoimprint technology. The etching processes include dry etching, wet etching, and/or other etching methods.

Spacers 152 are disposed on the sidewalls of the gate structure 150, such as along the gate electrode. The spacers 152 include a dielectric material, such as silicon oxide, silicon nitride, silicon oxynitride, other suitable material, or combinations thereof. The spacers may include a multi-layer structure, such as a multi-layer structure including a silicon nitride layer and a silicon oxide layer. The spacers are formed by a suitable process to a suitable thickness. For example, in the depicted embodiment, spacers 152 may be formed by depositing a silicon nitride layer and then dry etching the layer to form the spacers 152 as illustrated in FIG. 2. Before or after forming the spacers 152, implantation, diffusion, and/or annealing processes may be performed to form lightly doped source and drain (LDD) features in the source and drain regions of the fin structures 115A and 115B.

Figure 3:
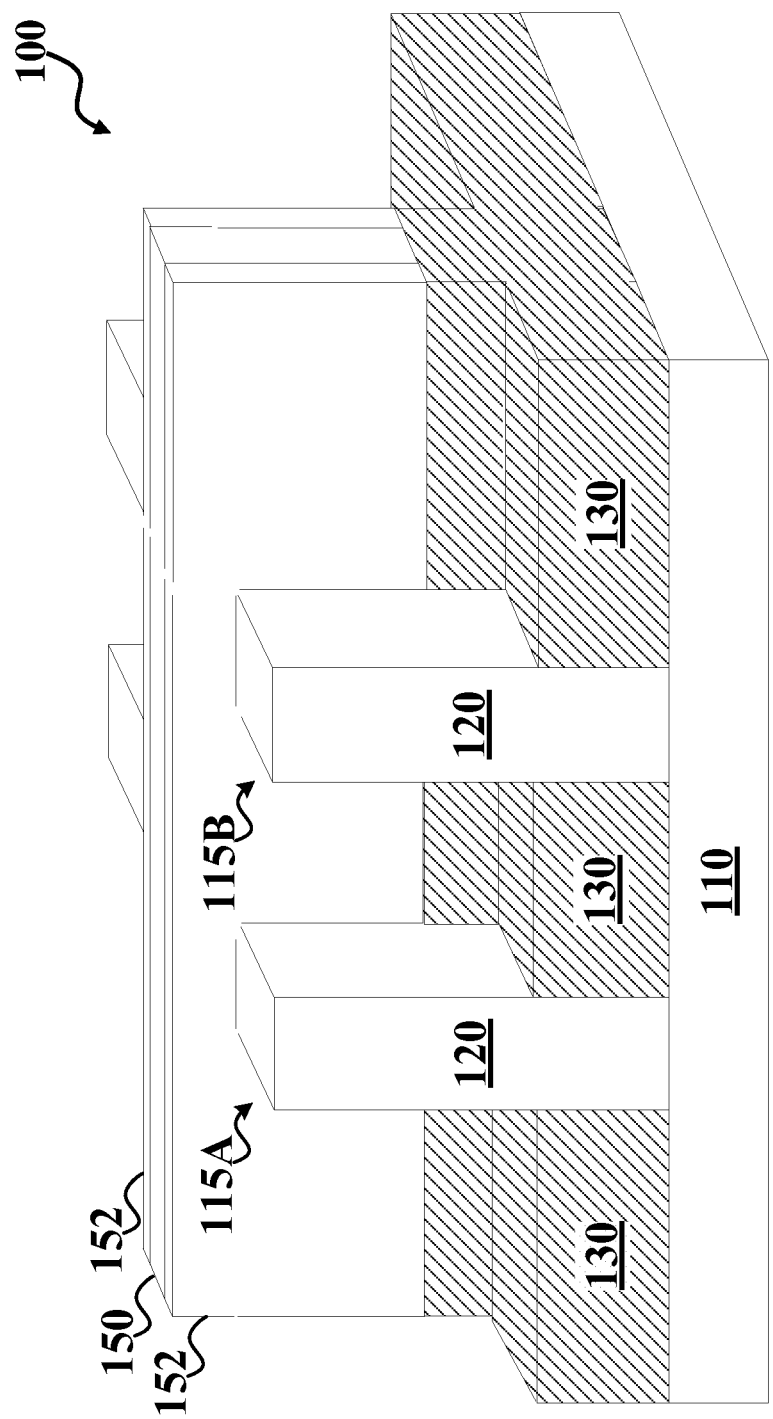

Referring to FIG. 3, a process is performed to recess the isolation features 130. For example, an etching process is applied to recess the isolation features 130. The etching process is a dry etching process, wet etching process, other etching process, or combinations thereof. In the depicted embodiment, the etching process selectively etches the isolation features 130 and implements processing parameters that avoid etching the silicon nitride spacers 152. For example, in the depicted embodiment, the etching process uses a hydrofluoric acid (HF) etching solution of a suitable concentration (for example, 100:1). In an example, the HF solution recesses the isolation features 130 about 100 Å. Alternatively, other etching solutions may be used to effectively recess the isolation features 130.

Figure 4:
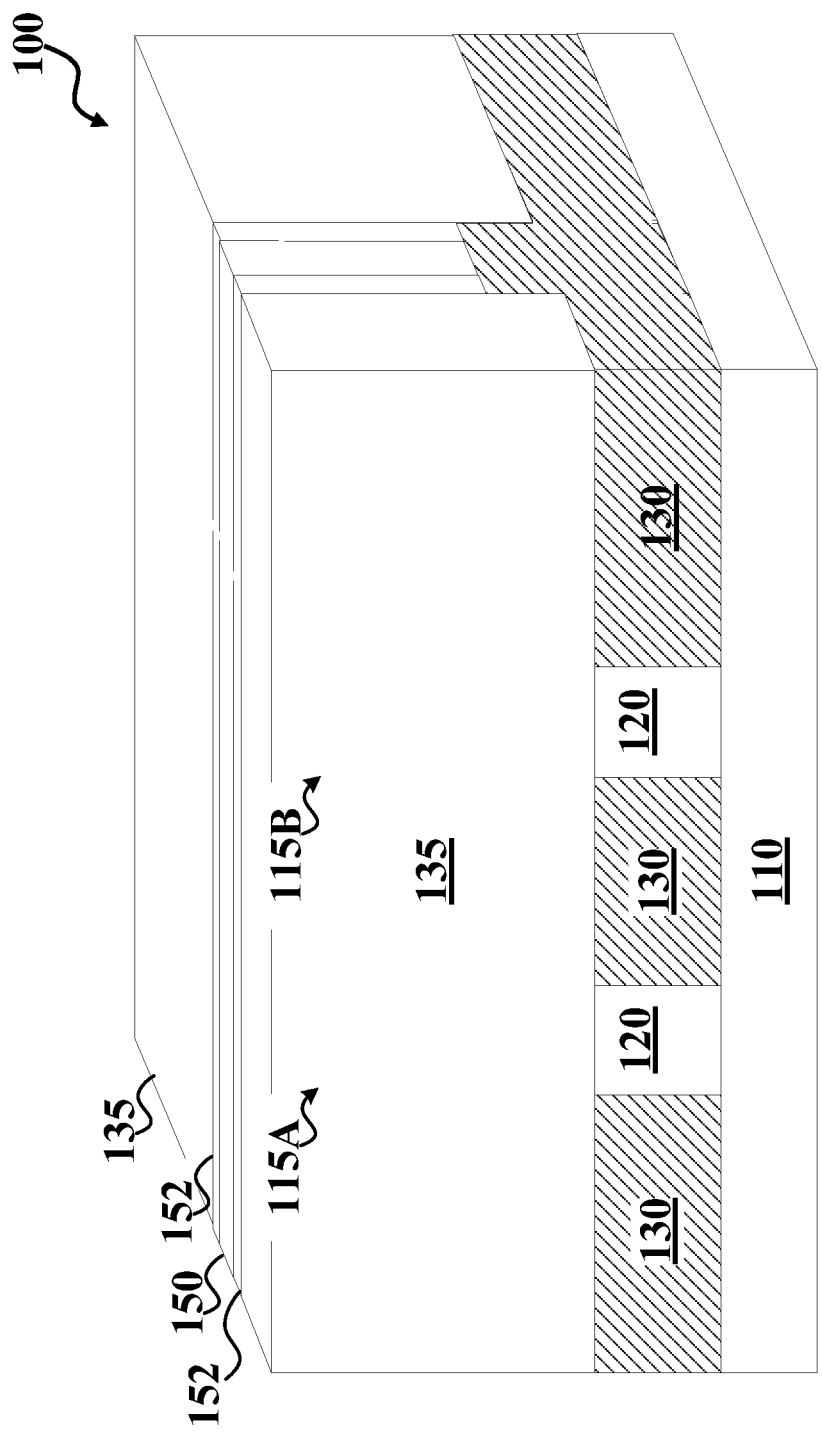

Referring to FIG. 4, a fin template 135 is formed on exposed portions of the fins 120. For example, the fin template 135 is formed by merging together the fins 120 of the FinFET device 100. In the depicted embodiment, merging the fins 120 together is achieved by epitaxially (epi) growing a semiconductor material on exposed portions of the fins 120 in the source and drain regions of the fin structures 115A and 115B. The semiconductor material is epitaxially grown by an epi process until the fins 120 of the fin structures 115A and 115B are merged together to form the fin template 135. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors. In the depicted embodiment, the fin template 135 is silicon formed by a silicon epitaxial deposition process. The fin template 135 can be referred to as a bulk-like Si template. Alternatively, the fin template 135 could be silicon germanium (SiGe) formed by a silicon germanium epitaxial deposition process. The fin template 135 may be doped during deposition (growth) by adding impurities to the source material of the epitaxy process or subsequent to its deposition growth process by an ion implantation process. For example, the epi silicon fin template 135 may be doped with phosphorous (to form a Si:P epi layer). The doped epitaxial layer may have a gradient doping profile. A chemical mechanical polishing (CMP) process may be performed to planarize the fin template 135. Though the fins 120 and fin template 135 are depicted separately, it is understood that "fin template" can refer to the newly grown epi semiconductor material alone (depicted as fin template 135) or the newly grown epi semiconductor material combined with the initial fins (depicted as fins 120).

Figure 5:
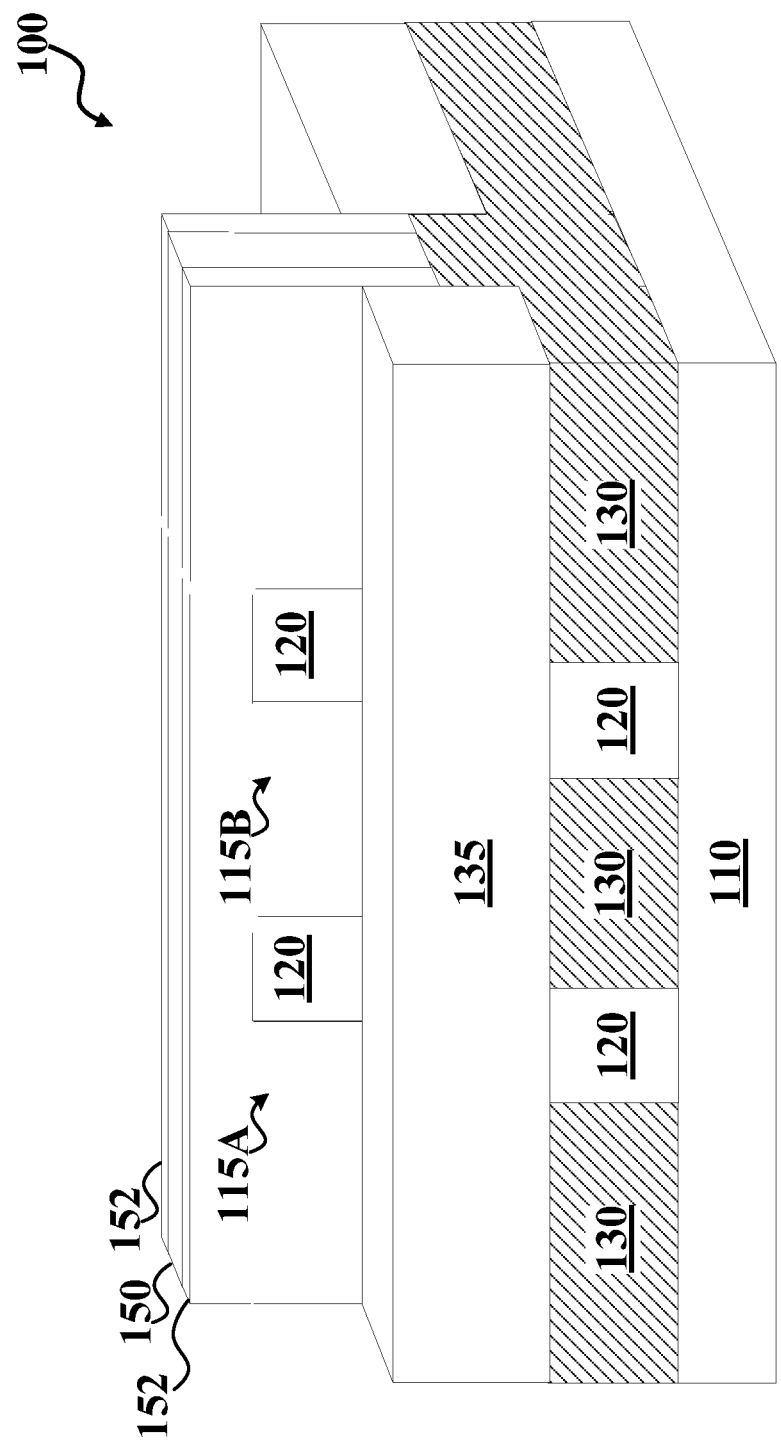

Referring to FIG. 5, a process is performed to recess the fin template 135. For example, an etching process is applied to the fin template 135 to etch back the fin template 135. The etching process is a dry etching process, wet etching process, other etching process, or combinations thereof. In an example, the etching process uses a mixture of HBr, $Cl_2$, and $O_2$. Alternatively, other etching process mixtures may be used to effectively recess the fin template 135. A radio frequency (RF) bias power of the etching process may be about 30 Watts (W) to about 400 W. The fin template 135 is etched back sufficiently to expose the channels of the fin structures 115A and 115B as illustrated in FIG. 5. This ensures that later-formed raised source and drain features (semiconductor material 160) can effectively introduce strain into the channels of the fins structures 115A and 115B.

Figure 6:
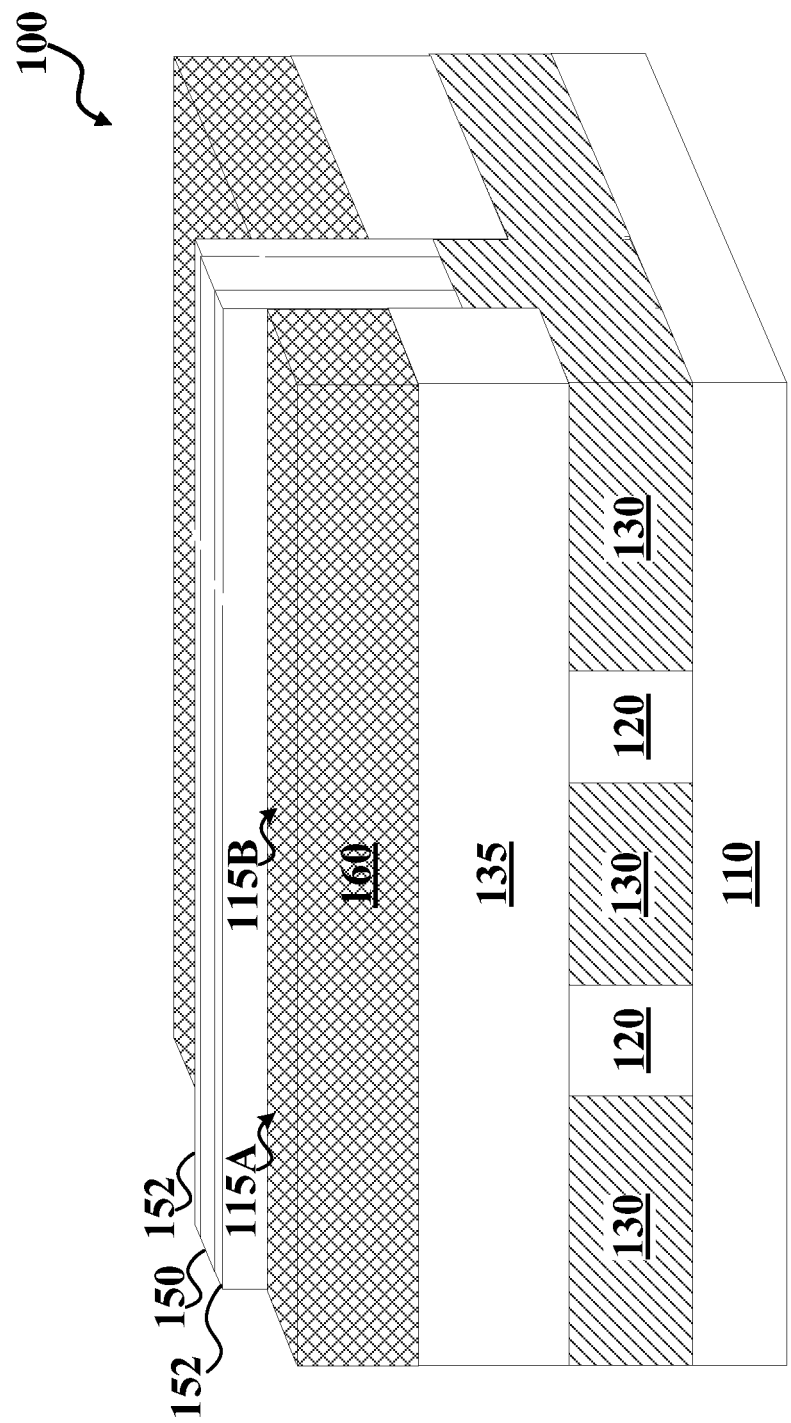

Referring to FIG. 6, a semiconductor material 160 is epitaxially grown over the fin template 135. In the depicted embodiment, a semiconductor material is epi grown on the exposed fin template 135 in the source and drain regions of the fin structures 115A and 115B. The epi grown semiconductor material 160 generates channel strain for the fin structures 115A and 115B. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors. In the depicted embodiment, the semiconductor material 160 is silicon germanium (SiGe) formed by a silicon germanium epitaxial deposition process. Alternatively, the semiconductor material 160 could be silicon formed by a silicon epitaxial deposition process. The semiconductor material 160 may be doped during deposition (growth) by adding impurities to the source material of the epitaxy process or subsequent to its deposition growth process by an ion implantation process. A CMP process may be performed to planarize the semiconductor material 160. The semiconductor material 160 may be referred to as raised source and drain features of the source and drain regions of the fin structure 115A and 115B. It should be noted that the fin template 135 in the source and drain regions of the fin structures 115A and 115B may also be considered as part of the raised source and drain features. Before or after forming the semiconductor material 160, implantation, diffusion, and/or annealing processes may be performed to form heavily doped source and drain (HDD) features in the source and drain regions of the fin structures 115A and 115B.

Conventional FinFET devices form raised source and drain features (for example, semiconductor material 160) on unmerged fins, such as the fins 120 as illustrated in FIG. 2. As technology nodes continually scale down, a width of the unmerged fins, such as the fins 120, continues to decrease, for example, to about 15 nm and below. It has been observed that the raised source and drain features grown on the exposed surfaces of the unmerged fins, such as along the width of the unmerged fins, provides insufficient strain as technology nodes decrease. For example, the strain provided by the raised source and drain features formed over unmerged fins tend to relax along the width direction of the unmerged fins. This can occur because of space between adjacent unmerged fins (in other words, free space). As the strain (stress) relaxes in the fin width direction, defects and dislocations may occur in the raised source and drain features, negatively effecting device performance. In contrast, to remedy the stress relaxation issues inherent in conventional FinFET devices, the disclosed method 10 merges fins 120 together to form the fin template 135 for FinFET device 100. The method 10 provides a self-aligned source/drain template growth scheme that can be easily implemented into integrated circuit processing and provide maximum raised source and drain features for enhancing FinFET device performance. In particular, the fin template 135 provides a planar-like source and drain area for forming the raised source/drain features in the source and drain regions of the fin structures 115A and 115B. This provides minimal stress relaxation along the fin width direction and achieves planar-like channel strain. The disclosed FinFET device 100 can thus provide maximum strain to the channels of the fin structures 115A and 115B with limited (or sometimes no) defects and/or dislocations.

The FinFET device 100 may include additional features, which may be formed by subsequent processing. For example, silicide features may be formed in the source and drain regions of the fin structures 115A and 115B. The silicide features may be formed by a silicidation process, such as a self-aligned silicide (salicide) process. Various contacts/vias/lines and multilayer interconnect features (e.g., metal layers and interlayer dielectrics) may be formed over the substrate 110, configured to connect the various features or structures of the FinFET device 100. The additional features may provide electrical interconnection to the device 100 including the gate structure 150. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 7:
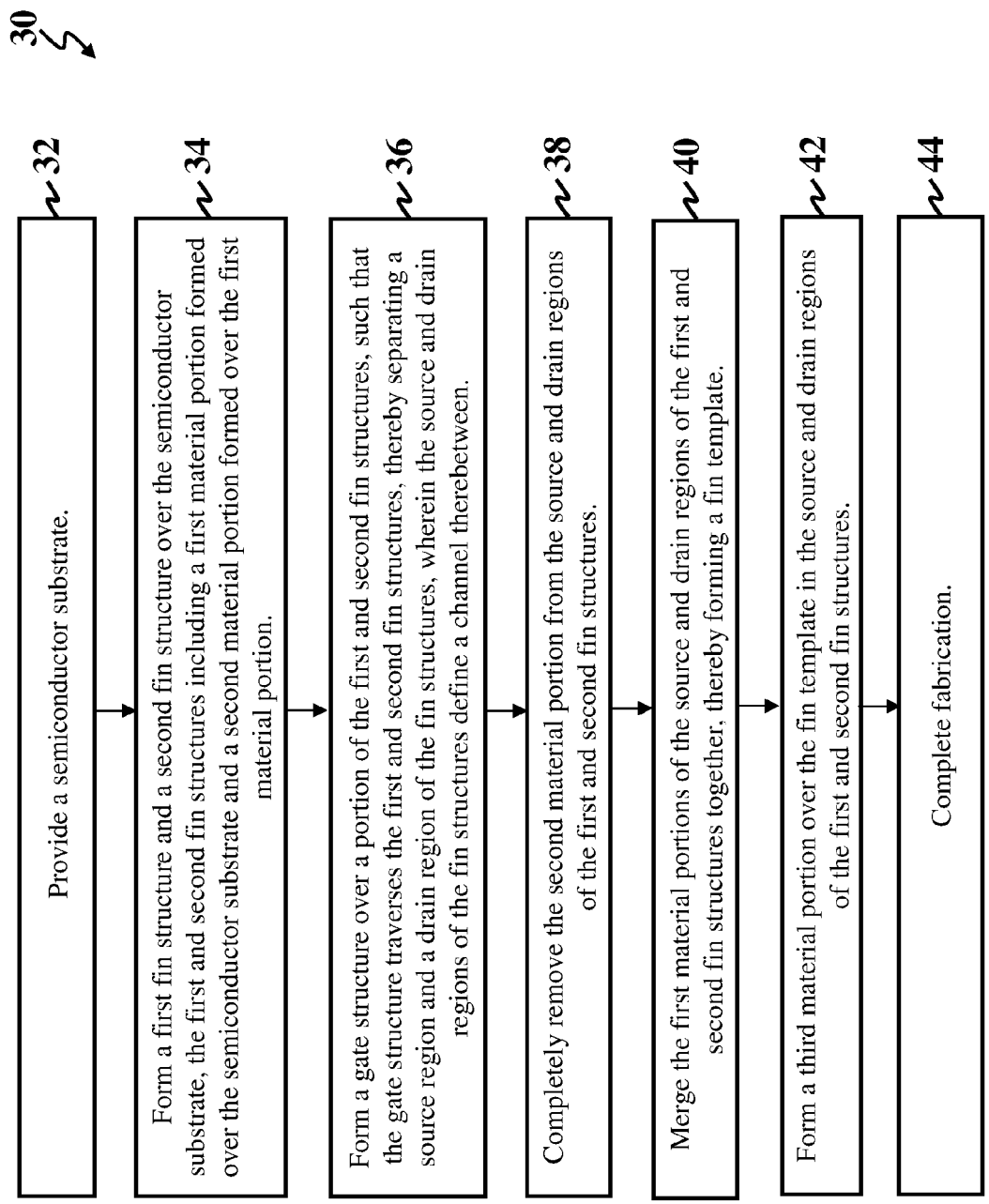
FIG. 7 is a flow chart of another method for fabricating a FinFET device according to aspects of the present disclosure.

FIG. 7 is a flow chart of a method 30 for fabricating an integrated circuit device according to various aspects of the present disclosure. In the depicted embodiment, the method 30 fabricates an integrated circuit device that includes a fin-like field effect transistor (FinFET) device. The method 30 begins at block 32 where a semiconductor substrate is provided. At block 34, a first fin structure and a second fin structure is formed over the semiconductor substrate. More specifically, a first material portion of the first and second fin structures is formed over the semiconductor substrate, and a second material portion of the first and second fin structures is formed over the first material portion. At block 36, a gate structure is formed over a portion of the first and second fin structures. The gate structure traverses the first and second fin structures, separating a source region and a drain region of the first and second fin structures. A channel is defined between the source and drain regions of the first and second fin structures. At block 38, the second material portion is completely removed from the source and drain regions of the first and second fin structures. At block 40, the first material portions of the source and drain regions of the first and second fin structures are merged together to form a fin template. At block 42, a third material portion is formed over the fin template in the source and drain regions of the first and second fin structures. The method 30 continues with block 44 where fabrication of the integrated circuit device is completed. Additional steps can be provided before, during, and after the method 30, and some of the steps described can be replaced or eliminated for other embodiments of the method.

FIGS. 8A-8C, 9A-9C, 10A-10C, and 11A-11C provide various views of a FinFET device 200, in portion or entirety, at various stages of fabrication according to the method 30 of FIG. 7. The term FinFET device refers to any fin-based transistor, such as a fin-based, multi-gate transistor. The FinFET device 200 may be included in a microprocessor, memory cell, and/or other integrated circuit device. In the depicted embodiment, the FinFET device 200 is a p-type metal-oxide-semiconductor (PMOS) FinFET device. FIGS. 8A-8C, 9A-9C, 10A-10C, and 11A-11C have been simplified for the sake of clarity to better understand the inventive concepts of the present disclosure. Additional features can be added in the FinFET device 200, and some of the features described below can be replaced or eliminated in other embodiments of the FinFET device 200.

Figure 8A:
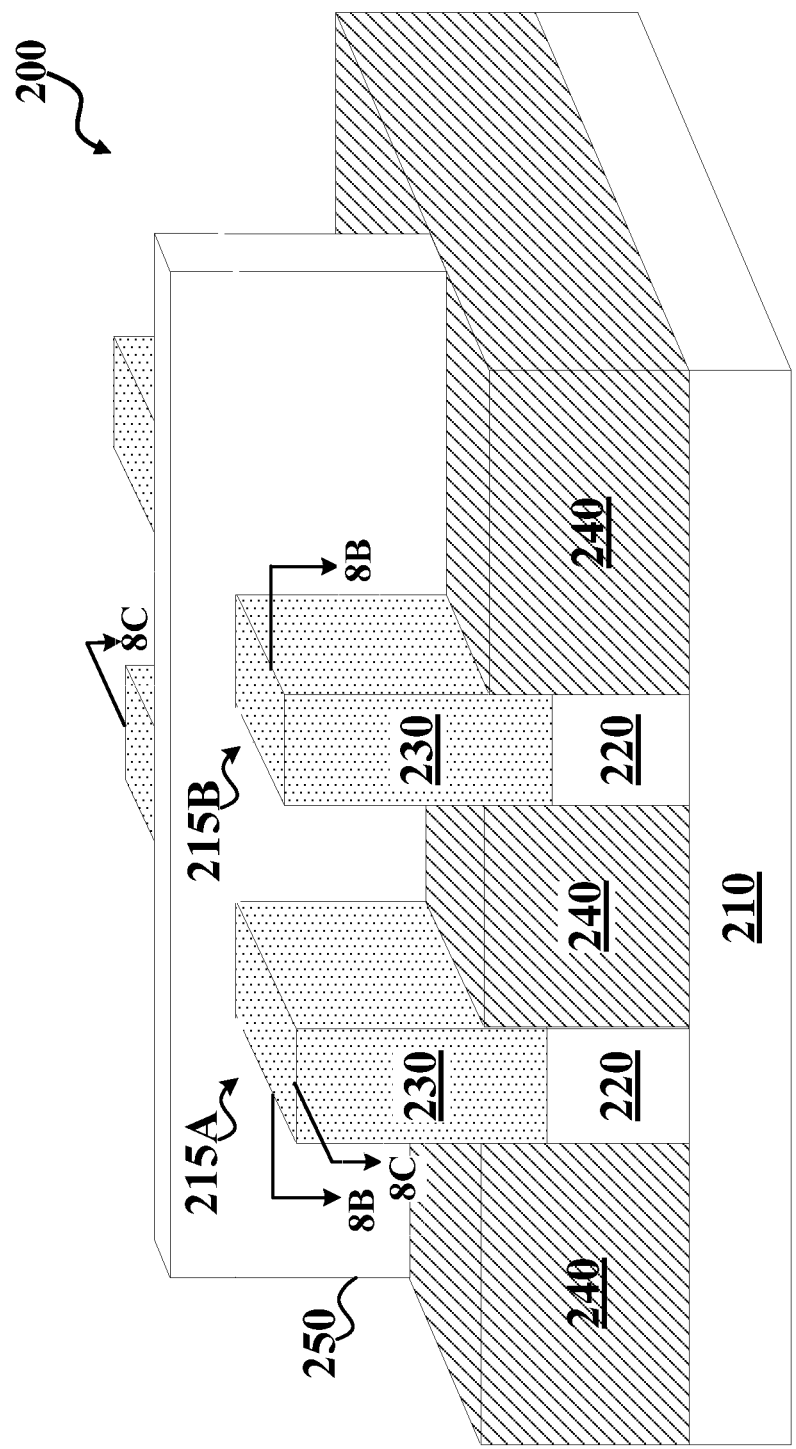
FIGS. 8A, 9A, 10A, and 11A are perspective views of a FinFET device at various fabrication stages according to the method of FIG. 7.
Figure 8B:
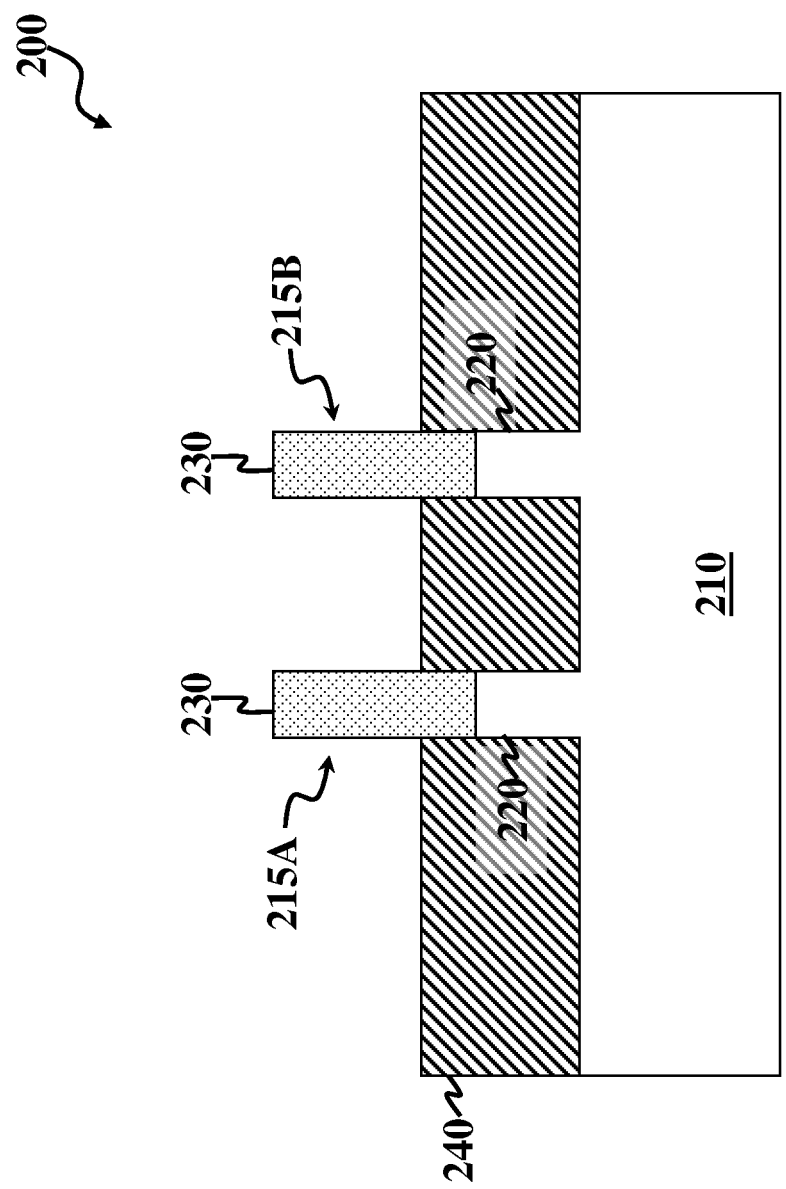
FIGS. 8B, 9B, 10B, and 11B are diagrammatic cross-sectional views of the FinFET device illustrated in FIGS. 8A, 9A, 10A, and 11A, respectively.
Figure 8C:
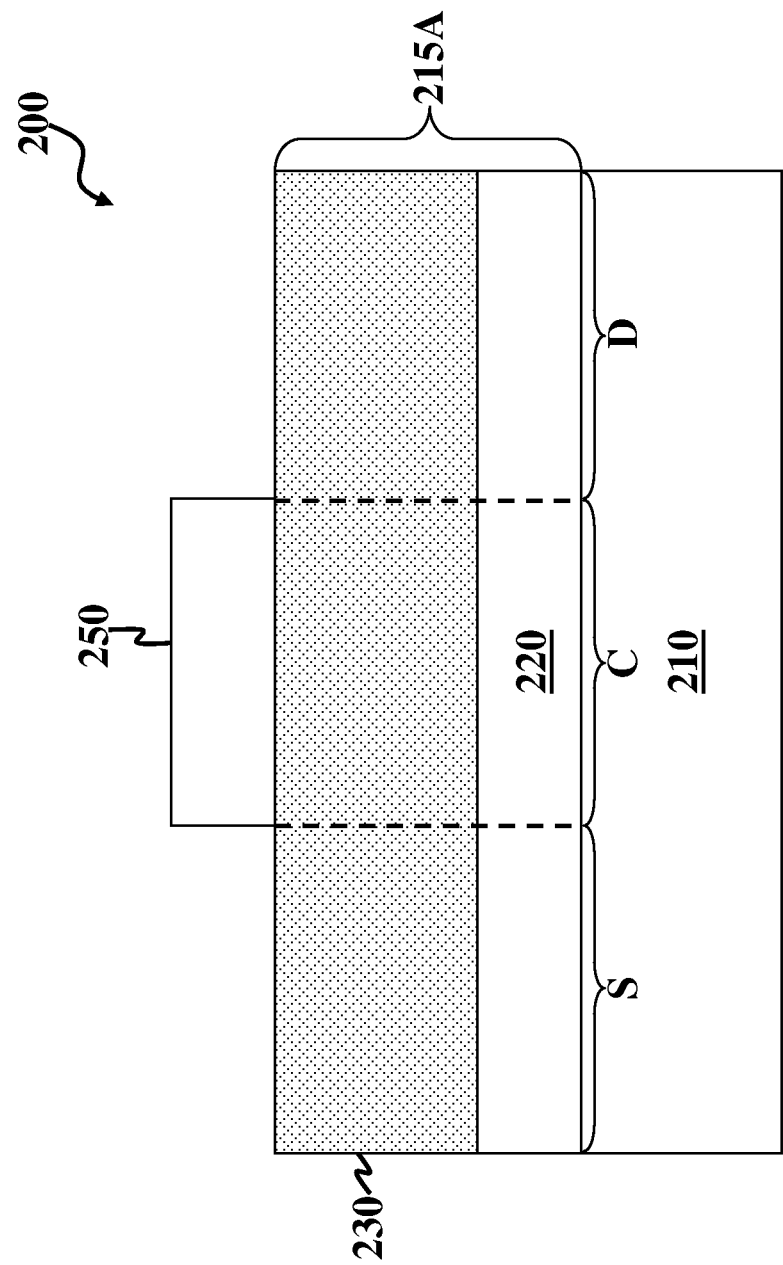
FIGS. 8C, 9C, 10C, and 11C are diagrammatic cross-sectional views of the FinFET device illustrated in FIGS. 8A, 9A, 10A, and 11A, respectively.

FIG. 8A is a perspective view of the FinFET device 200, FIG. 8B is a diagrammatic cross-sectional view of the FinFET device 200 taken along line 8B-8B in FIG. 8A, and FIG. 8C is a diagrammatic cross-sectional view of the FinFET device 200 taken along line 8C-8C in FIG. 8A. The FinFET device 200 includes a substrate (wafer) 210. In the depicted embodiment, the substrate 210 is a bulk silicon substrate. Alternatively or additionally, the substrate 210 includes an elementary semiconductor, such as silicon or germanium in a crystalline structure; a compound semiconductor, such as silicon carbide, gallium arsenic, gallium phosphide, indium phosphide, indium arsenide, and/or indium antimonide; or combinations thereof. Alternatively, the substrate 210 is a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

The FinFET device 200 includes fin structures 215A and 215B that extend from the substrate 210. In the depicted embodiment, the fin structures 215A and 215B include fin portions 220 and 230. The fin portions 220 include silicon (Si), and the fin portions 230 include silicon germanium (SiGe). The SiGe concentration of the fin portion 230 may be represented by $Si_{1-x}Ge_x$, where x represents Ge composition in atomic percent. In the depicted embodiment, x is less than or equal to 1, and greater than or equal to 0. FIG. 8C is a diagrammatic cross-sectional view of the FinFET device 200 taken along a channel of the fin structure 215A, which depicts a source region S and a drain region D of the fin structure 215A. A channel region C is defined between the source and drain regions. Fin structure 215B similarly includes source, drain, and channel regions. It is noted that the term "fin structure" in the depicted embodiment refers to individual fins of the FinFET device 200. However, the term "fin structure" may also refer to the fins collectively, and thus, fin structure may also refer collectively to fin structures 215A and 215B. Further, though the depicted embodiment illustrates two fins, the FinFET device 200 may include fewer or more fins depending on design requirements of the FinFET device 200.

The fin structures 215A and 215B, including fin portions 220 and 230, are formed by a suitable process. In one example, the fin structures 215A and 215B are formed by implementing a lithography and etching process to form the fin portion 220, and implementing an epitaxial growth process to form the fin portion 230. For example, beginning with the substrate 210, a lithography and etching process forms trenches in the substrate 210, thereby forming fin portions 220 (referred to as Si fin portions) of the fin structures 215A and 215B, which extend from the substrate 210. The lithography process may include photoresist coating (e.g., spin-on coating), soft baking, mask aligning, exposure, post-exposure baking, developing the photoresist, rinsing, drying (e.g., hard baking), other suitable processes, or combinations thereof. For example, the fin portions 220 may be formed by forming a photoresist layer (resist) overlying the substrate 210, exposing the resist to a pattern, performing a post-exposure bake process, and developing the resist to form a masking element including the resist. The masking element may then be used to etch the fin portions 220 into the silicon substrate 210. The etching process may be a dry etching process, wet etching process, other suitable etching process, or combinations thereof. For example, the fin portions 220 may be etched into the substrate 210 using a reactive ion etch (RIE). Alternatively, the lithography process could be implemented or replaced by other methods, such as maskless photolithography, electron-beam writing, ion-beam writing, and/or nanoimprint technology. The fin portions 220 may be formed by a DPL process, which is described above.

After the fin portions 220 are etched into the substrate 210, an insulation layer can be formed over the substrate 210, including over the fin portions 220. The insulation layer fills the trenches in the substrate 210. Portions of the insulation layer are then removed to form openings in the insulation layer that expose a top surface of the fin portions 220. A semiconductor material can be epitaxially (epi) grown on the exposed surfaces of the fin portions 220 to form fin portions 230 of the fin structures 215A and 215B. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin portions 220 (in other words, interact with the Si fin portions 220). In the depicted embodiment, the fin portions 230 include silicon germanium (SiGe) formed by a silicon germanium epitaxial deposition process. Alternatively, the fin portions 230 could comprise epitaxially grown silicon. The fin portions 230 may be doped during deposition (growth) by adding impurities to the source material of the epitaxy process or subsequent to its deposition growth process by an ion implantation process. For example, an epi silicon fin portion may be doped with phosphorous (to form a Si:P epi layer). The doped epitaxial layer may have a gradient doping profile. A CMP process may be performed to planarize the fin portions 230. Thereafter, the remaining insulation layer may be subjected to an etch back process, or a CMP process, thereby forming isolation features (such as isolation features 240).

In another example, the fin structures 215A and 215B are formed by implementing a lithography and etching process to form the fin portion 220, and implementing a condensation process to form the fin portion 230. The condensation process may implement the methods described in U.S. patent application Ser. No. 12/702,862, entitled Bottom-Notched SiGe FinFET Formation by Condensation Method, filed Feb. 9, 2010, which is hereby incorporated by reference in its entirety. For example, beginning with the substrate 210, a lithography and etching process forms trenches in the substrate 210, thereby forming fin portions 220 (referred to as Si fin portions) of the fin structures 215A and 215B, which extend from the substrate 210. The lithography and etching process may be similar to that described above. Thereafter, an insulation layer can be formed over the substrate 210, filling in the trenches. The insulation layer may be subjected to an etch back process to form isolation features (such as isolation features 240). A semiconductor material is then epitaxially (epi) grown on the exposed fin portions 220. For example, SiGe is grown on the exposed fin portions 220 by an epitaxial process, similar to the epitaxial processes described above. Thereafter, a SiGe condensation process causes Ge from the SiGe material to diffuse into fin portions 220 (Si fins), forming fin portions 230. Thereafter, the isolation features may be subjected to an etch back process, or a CMP process.

Isolation features 240, such as shallow trench isolation (STI) structures, surround the fin structures 215A and 215B, isolating the fin structures 215A and 215B from each other and other not-illustrated integrated circuit devices. The isolation features 240 may be formed by partially filling trenches surrounding the fin structures 215A and 215B with an insulating material, such as silicon oxide, silicon nitride, silicon oxynitride, other suitable material, or combinations thereof. The filled trench may have a multi-layer structure, for example, a thermal oxide liner layer with silicon nitride filling the trench.

The FinFET device 200 includes a gate structure 250. The gate structure 250 traverses the fin structures 215A and 215B, and in the depicted embodiment, is formed on a central portion of the fin structures 215A and 215B. The gate structure 250 may include a gate dielectric layer and a gate electrode. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 250, such as the gate electrode, may be formed in a gate first or gate last process. The gate structure 250 may include numerous other layers, for example, capping layers, interface layers, diffusion layers, barrier layers, hard mask layers, or combinations thereof.

The gate structure 250 is formed by a suitable process, including deposition, lithography patterning, and etching processes. The deposition processes include CVD, PVD, ALD, HDPCVD, MOCVD, RPCVD, PECVD, LPCVD, ALCVD, APCVD, plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Spacers (not illustrated) may be disposed on the sidewalls of the gate structure 250, such as along the gate electrode. The spacers may be similar to spacers 152 described above with reference to FIG. 2. For example, the spacers include a dielectric material, such as silicon oxide, silicon nitride, silicon oxynitride, other suitable material, or combinations thereof. The spacers may include a multi-layer structure, such as a multi-layer structure including a silicon nitride layer and a silicon oxide layer. The spacers are formed by a suitable process to a suitable thickness. For example, spacers may be formed by depositing silicon nitride and silicon oxide layers and then dry etching the layers to form the spacers. Before or after the spacers are formed, implantation, diffusion, and/or annealing processes may be performed to form LDD features in the source and drain regions of the fin structures 215A and 215B.

Figure 9A:
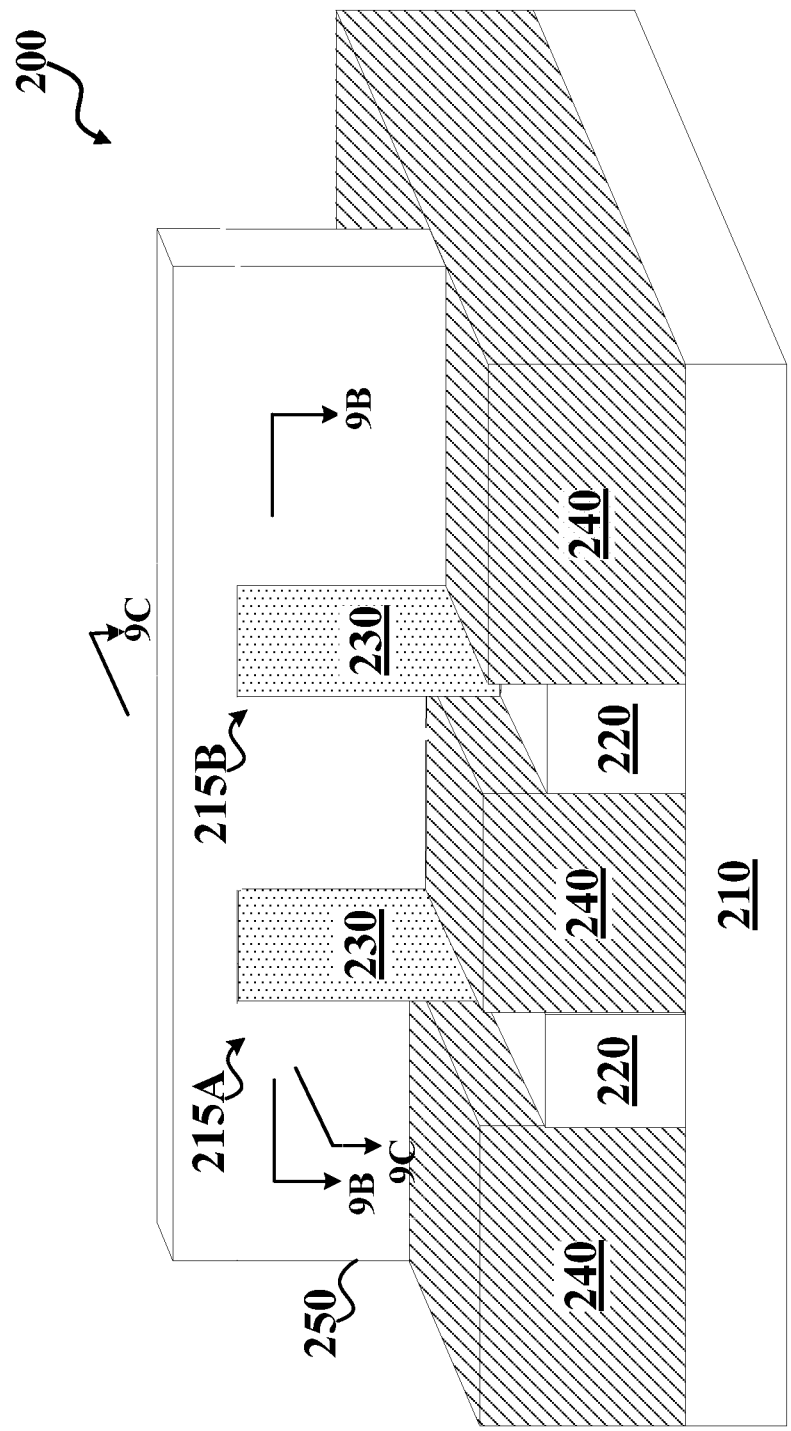
Figure 9B:
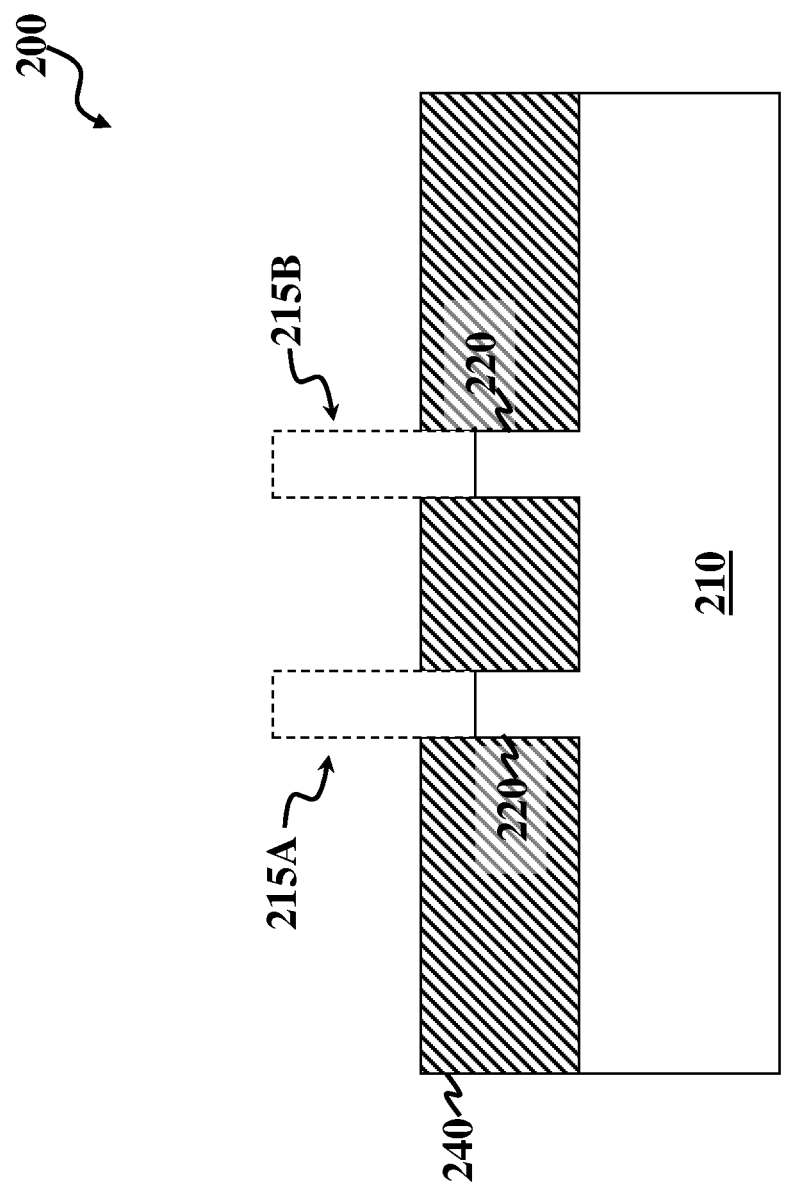
Figure 9C:
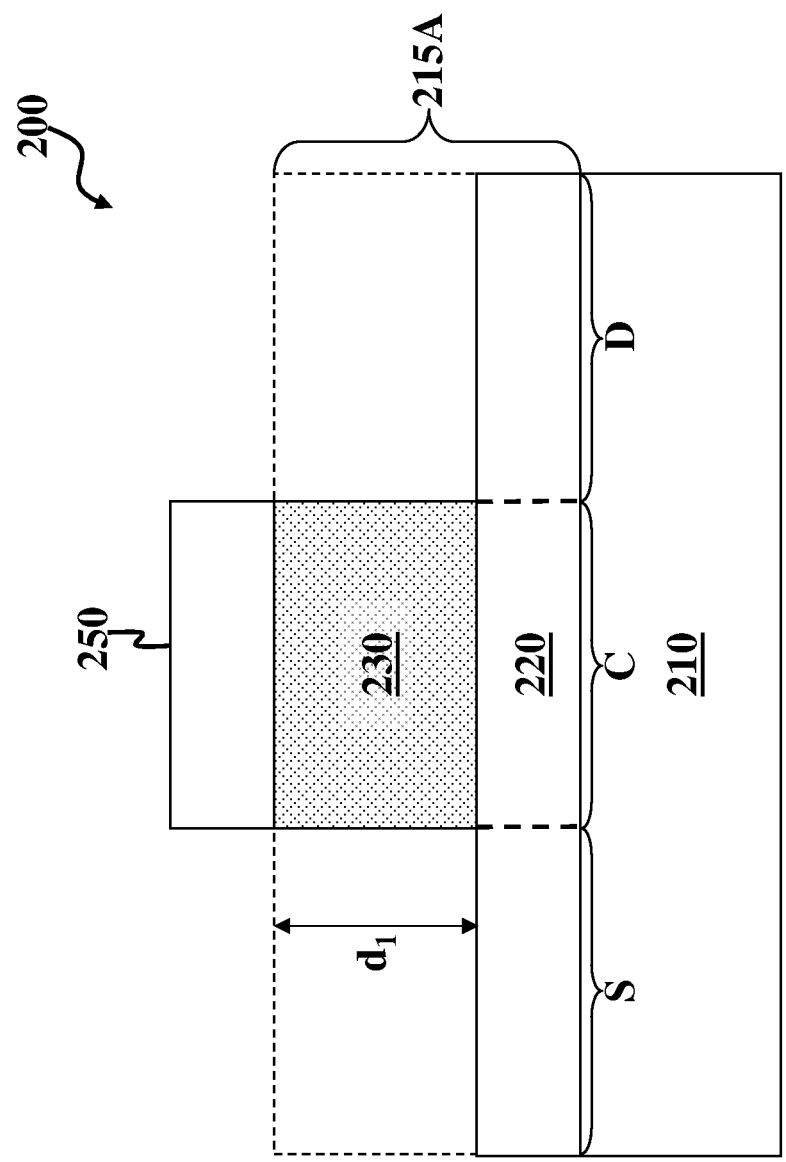

FIG. 9A is a perspective view of the FinFET device 200, FIG. 9B is a diagrammatic cross-sectional view of the FinFET device 200 taken along line 9B-9B in FIG. 9A, and FIG. 9C is a diagrammatic cross-sectional view of the FinFET device 200 taken along line 9C-9C in FIG. 9A. In FIGS. 9A-9C, the fin portions 230 are completely removed from the source and drain regions of the fin structures 215A and 215B. More specifically, an etching process completely removes the fin portions 230 from the source and drain regions of the fin structures 215A and 215B, exposing the fin portions 220. The etching process is a dry etching process, wet etching process, other etching process, or combinations thereof. In an example, the etching process uses a mixture of HBr, $Cl_2$, and $O_2$. Alternatively, other etching process mixtures may be used to effectively remove the fin portions 230. A radio frequency (RF) bias power of the etching process may be about 30 Watts (W) to about 400 W. A lithography and etching process may be implemented to provide a protective layer over various features of the FinFET device 200 (for example, the gate structure 250 and/or isolation features 240) to prevent the protected features from being affected by the etching process. As illustrated in FIG. 9C, the fin portion 230 remains in the channel of the fin structures 215A and 215B, confined by the gate structure 250. The removed fin portions 230 form trenches in the source and drain regions of the fin structures 215A and 215B. The trench sidewalls may be defined by fin portions 220, isolation features 240, remaining fin portion 230 in the channel region, and/or protective layer (if formed). In the depicted embodiment, a depth ($d_1$) of the trenches extends from an initial top surface of the fin portions 230 to a top, exposed surface of the fin portion 220. Where a protective layer is provided, $d_1$ may extend from a top surface of the protective layer to the top, exposed surface of the fin portion 220. Other means of determining the trench depth may be used.

Figure 10A:
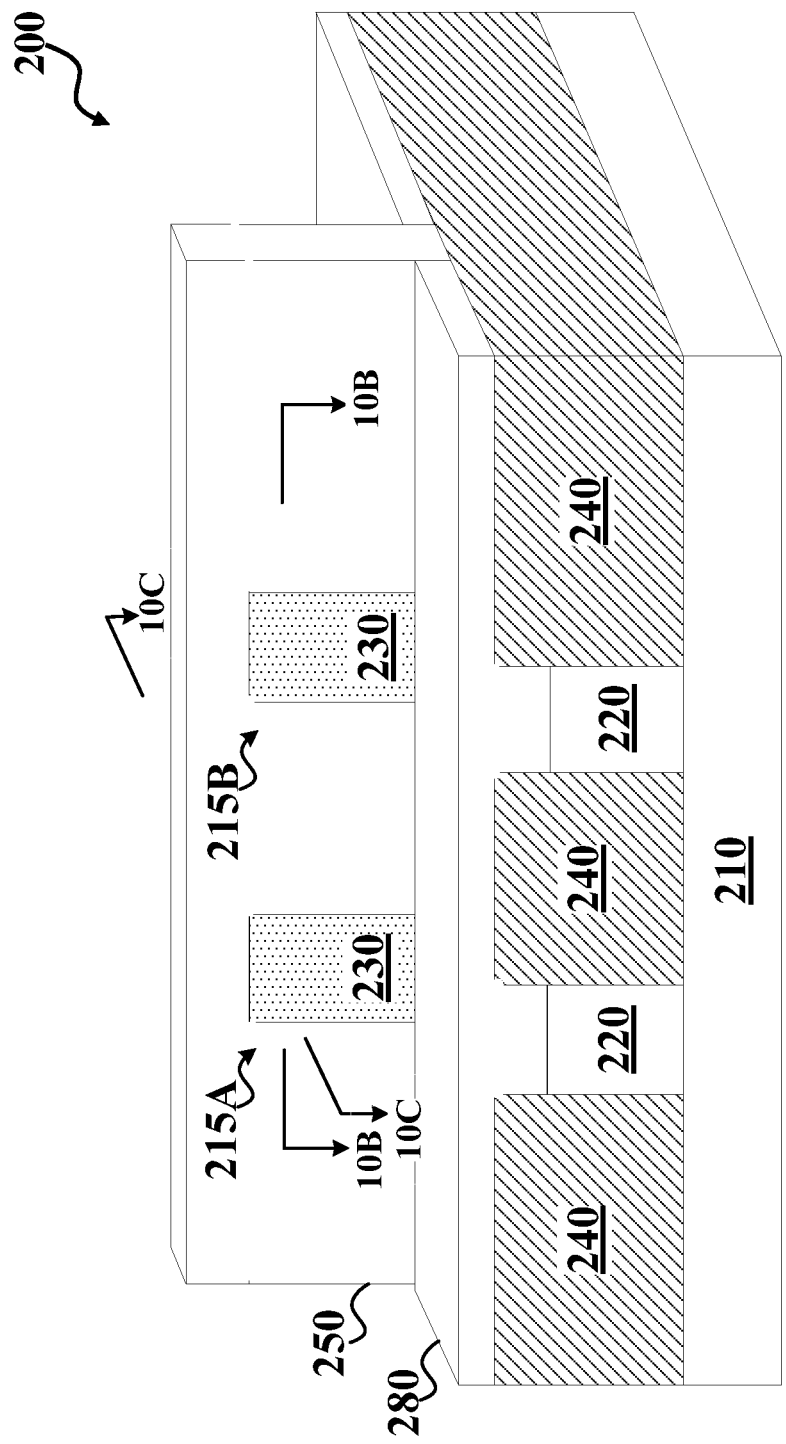
Figure 10B:
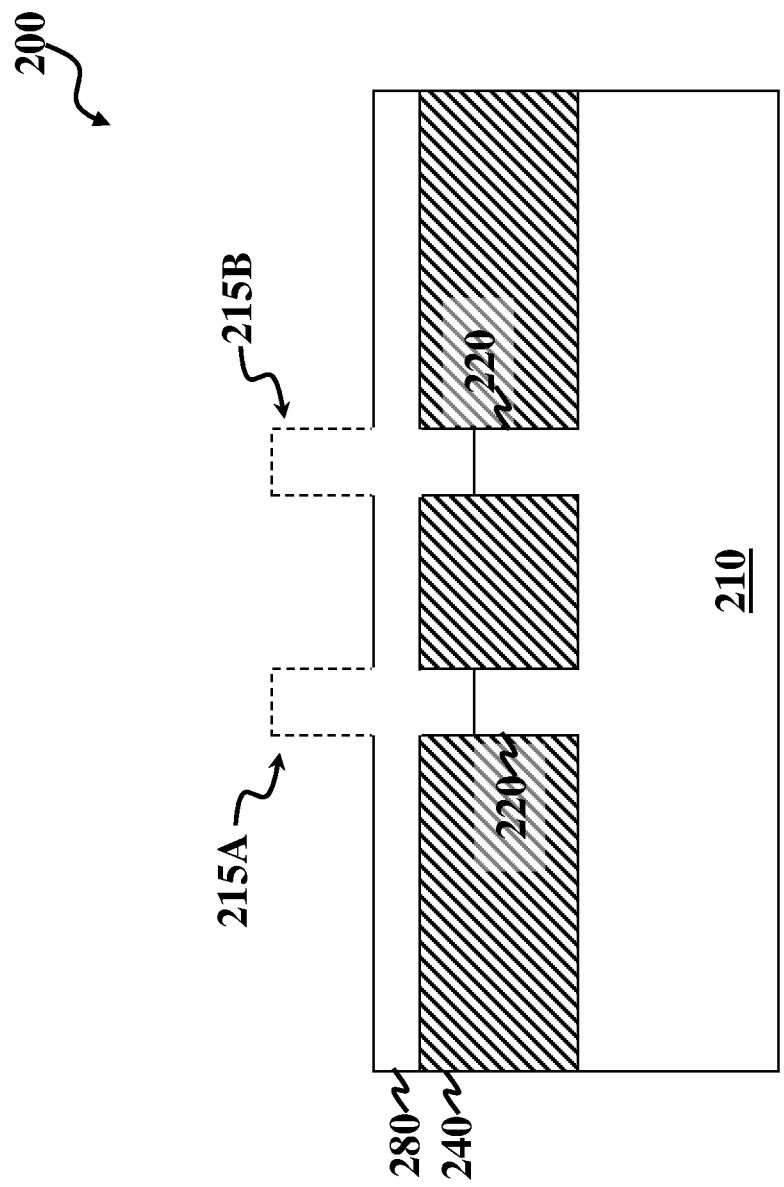
Figure 10C:
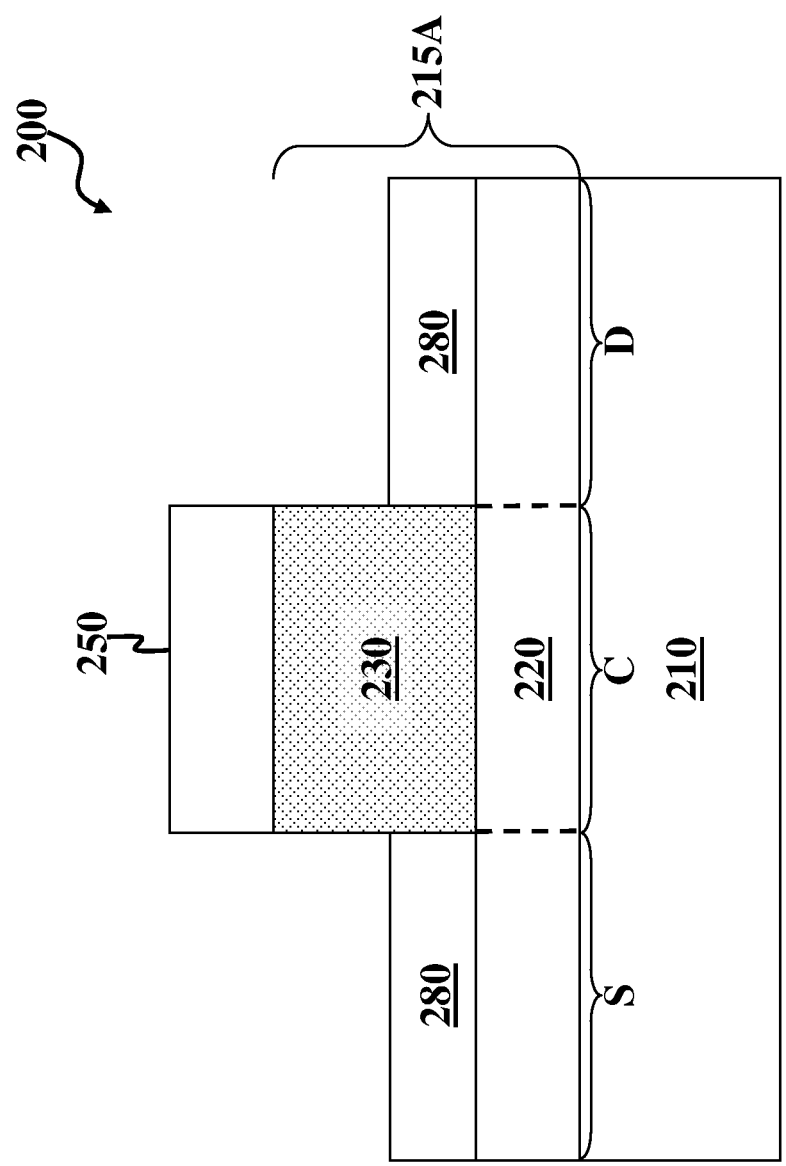

FIG. 10A is a perspective view of the FinFET device 200, FIG. 10B is a diagrammatic cross-sectional view of the FinFET device 200 taken along line 10B-10B in FIG. 10A, and FIG. 10C is a diagrammatic cross-sectional view of the FinFET device 200 taken along line 10C-10C in FIG. 10A. In FIGS. 10A-10C, the fin portions 220 in the source and drain regions of the fin structures 215A and 215B are merged together to form a fin template 280. For example, the fin template 280 may be formed by a process similar to that described above with reference to FIG. 5. In the depicted embodiment, a semiconductor material is epitaxially (epi) grown on the exposed fin portions 220 in the source and drain regions, until the fin portions 220 of the fin structures 215A and 215B are merged together to form the fin template 280. The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin template 280 is silicon formed by a silicon epitaxial deposition process. Alternatively, the fin template 280 could be silicon germanium (SiGe) formed by a silicon germanium epitaxial deposition process. The fin template 280 may be doped during deposition (growth) by adding impurities to the source material of the epitaxy process or subsequent to its deposition growth process by an ion implantation process. For example, an epi silicon fin portion may be doped with phosphorous (to form a Si:P epi layer). The doped epitaxial layer may have a gradient doping profile. A CMP process may be performed to planarize the fin template 280. Though the fin template 280 and fin portions 220 are depicted separately, it is understood that "fin template" can refer to the newly grown epi semiconductor material alone (depicted as fin template 280) or the newly grown epi semiconductor material combined with the initial fin portions (depicted as fin portions 220). Similar to the fin template 135 described above with reference to FIGS. 2-6, the fin template 280 can minimize stress relaxation along a width of the fin structures 215A and 215B, maximizing strain to the channels of fin structures 215A and 215B and enhancing device performance.

Figure 11A:
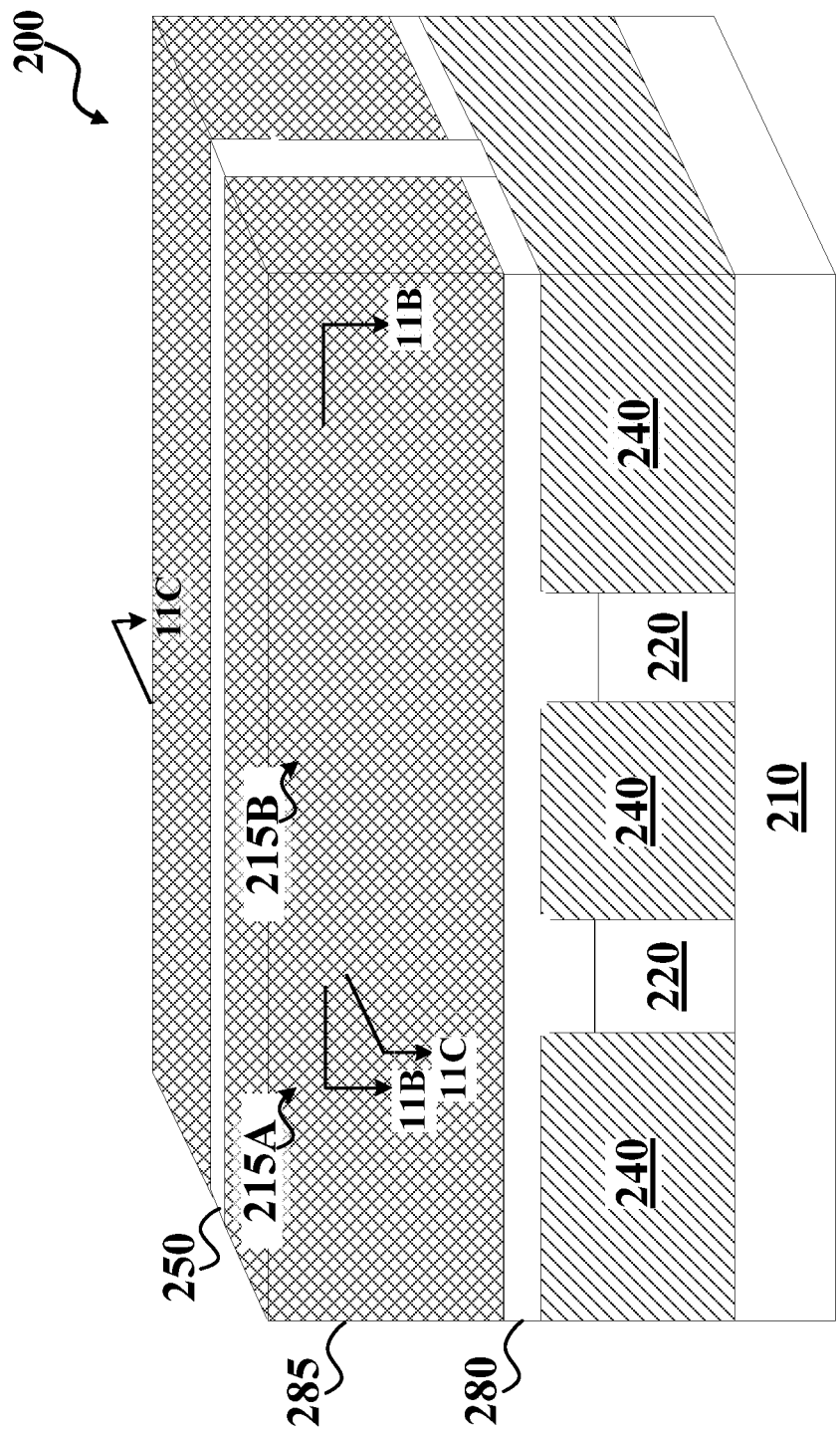
Figure 11B:
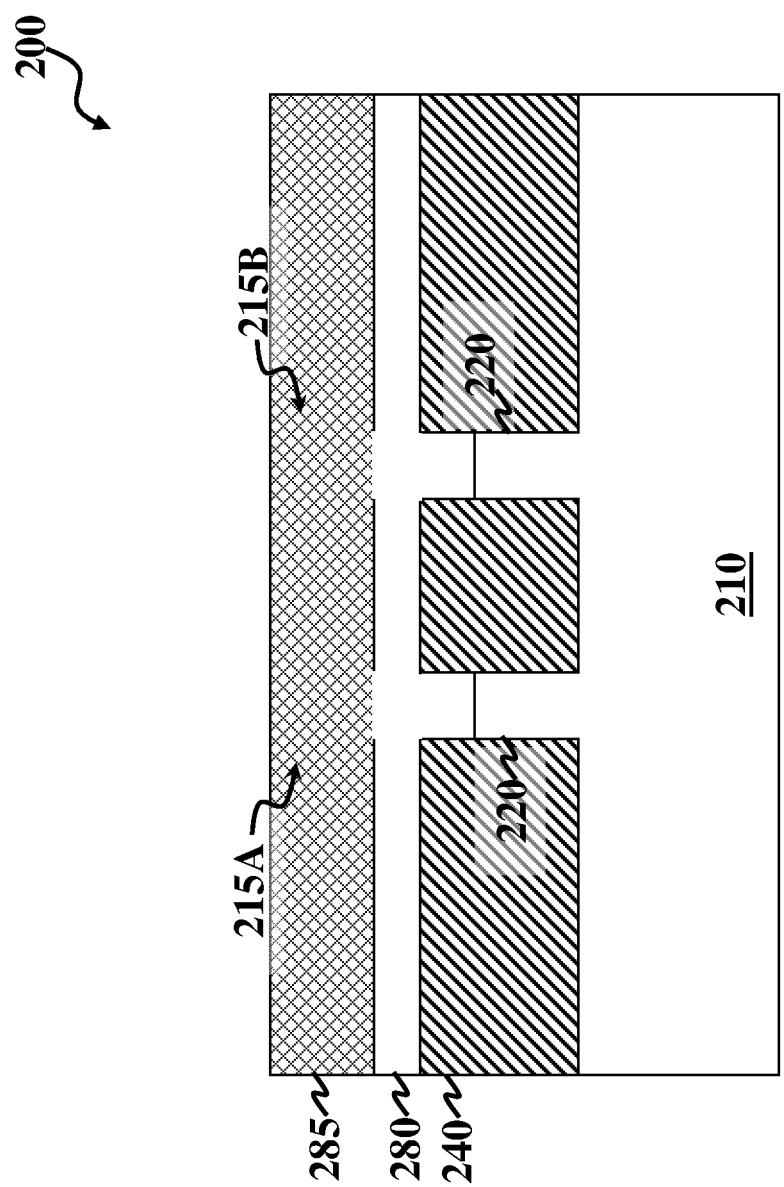
Figure 11C:
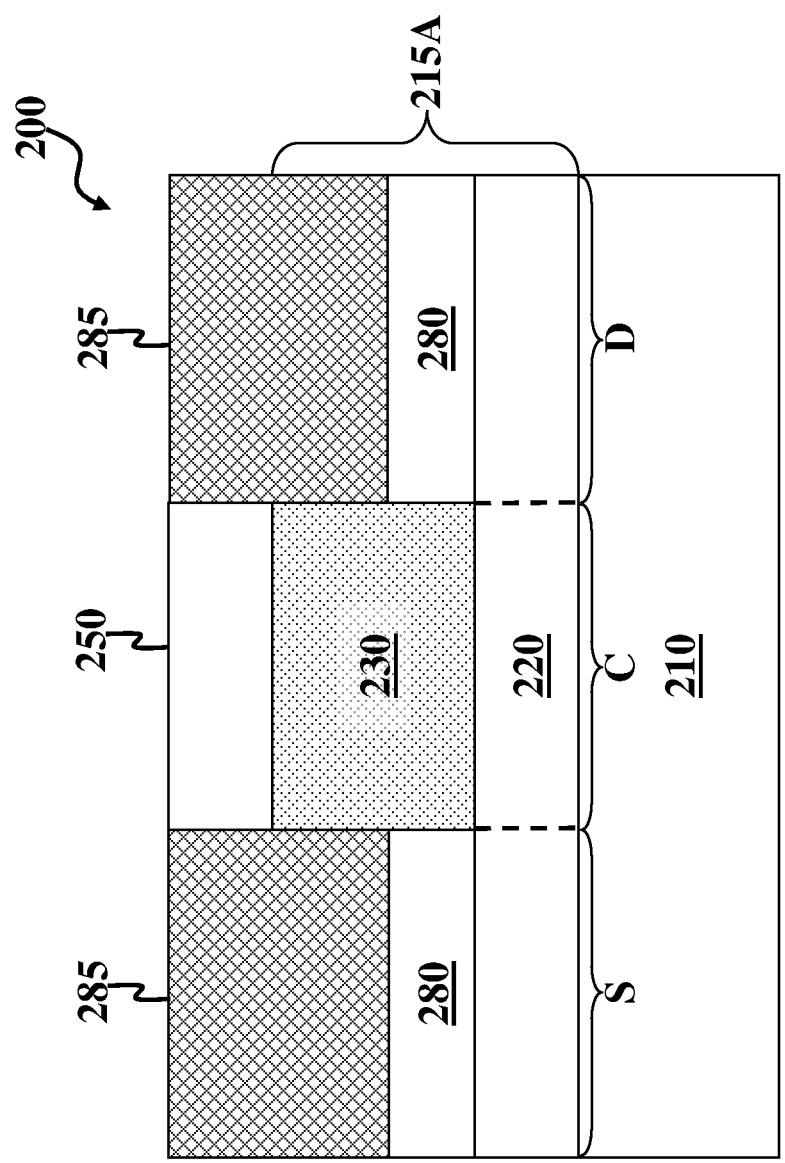

FIG. 11A is a perspective view of the FinFET device 200, FIG. 11B is a diagrammatic cross-sectional view of the FinFET device 200 taken along line 11B-11B in FIG. 11A, and FIG. 11C is a diagrammatic cross-sectional view of the FinFET device 200 taken along line 11C-11C in FIG. 11A. In FIGS. 11A-11C, a fin portion 285 is formed over the fin template 280, providing the fin structures 215A and 215B with fin portion 285. For example, a semiconductor material is epitaxially (epi) grown on the fin template 285. The epitaxy process may use CVD deposition techniques (e.g., VPE and/or UHV-CVD), molecular beam epitaxy, and/or other suitable processes. The epitaxy process may use gaseous and/or liquid precursors, which interact with the composition of the fin template 280 (in other words, interact with the Si fin template 280). In the depicted embodiment, the fin portion 285 is silicon germanium (SiGe) formed by a silicon germanium epitaxial deposition process. The SiGe concentration of the fin portion 285 is represented by $Si_{1-y}Ge_y$, where y represents Ge composition in atomic percent. In the depicted embodiment, y is less than or equal to 1, and greater than or equal to 0. The fin portion 285 may be doped during deposition (growth) by adding impurities to the source material of the epitaxy process or subsequent to its deposition growth process by an ion implantation process. The doped epitaxial layer may have a gradient doping profile. A CMP process may be performed to planarize the fin portion 285. Further, before or after forming the fin portion 285, implantation, diffusion, and/or annealing processes may be performed to form HDD features in the source and drain regions of the fin structures 215A and 215B.

As illustrated in FIGS. 11A-11C, the fin structures 215A and 215B include fin portions 220, fin portions 230, fin template 280, and fin portions 285. More specifically, the source and drain regions of the fin structures 215A and 215B include fin portions 220, fin template 280, and fin portions 285. The channel of the fin structures 215A and 215B includes fin portion 220 and fin portion 230. The fin template 280 and/or fin portions 285 in the source and drain regions of the fin structures 215A and 215B are alternatively referred to as strained source and drain features of the FinFET device 200. In the depicted embodiment, fin portions 220 include Si, fin template 280 includes Si, fin portions 230 include $Si_{1-x}Ge_x$, and fin portions 285 include $Si_{1-y}Ge_y$. The fin portions 285 provide compressive stress to the channel of the fin structures 215A and 215B, enhancing hole mobility in the PMOS FinFET device 200. In the depicted embodiment, y is independent of x in PMOS FinFET device 200. Accordingly, the fin portions 285 may include any Ge concentration and still achieve the compressive strain desired for PMOS FinFET devices. By forming the fin portions 285 over the Si fin portions (fin template 280), compressive strain is achieved regardless of the SiGe concentration of the channel. For example, compressive strain from the Si fin template 280 on the $Si_{1-y}Ge_y$ fin portions 285 cause the fin portions 285 to push/stress the channel/fin portions 230, providing uniaxial stress to the channel of the FinFET device 200.

The FinFET device 200 may include additional features, which may be formed by subsequent processing. For example, silicide features may be formed in the source and drain regions of the fin structures 215A and 215B, specifically on fin portions 285. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 200. The additional features may provide electrical interconnection to the device 200 including the gate structures 250. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 12:
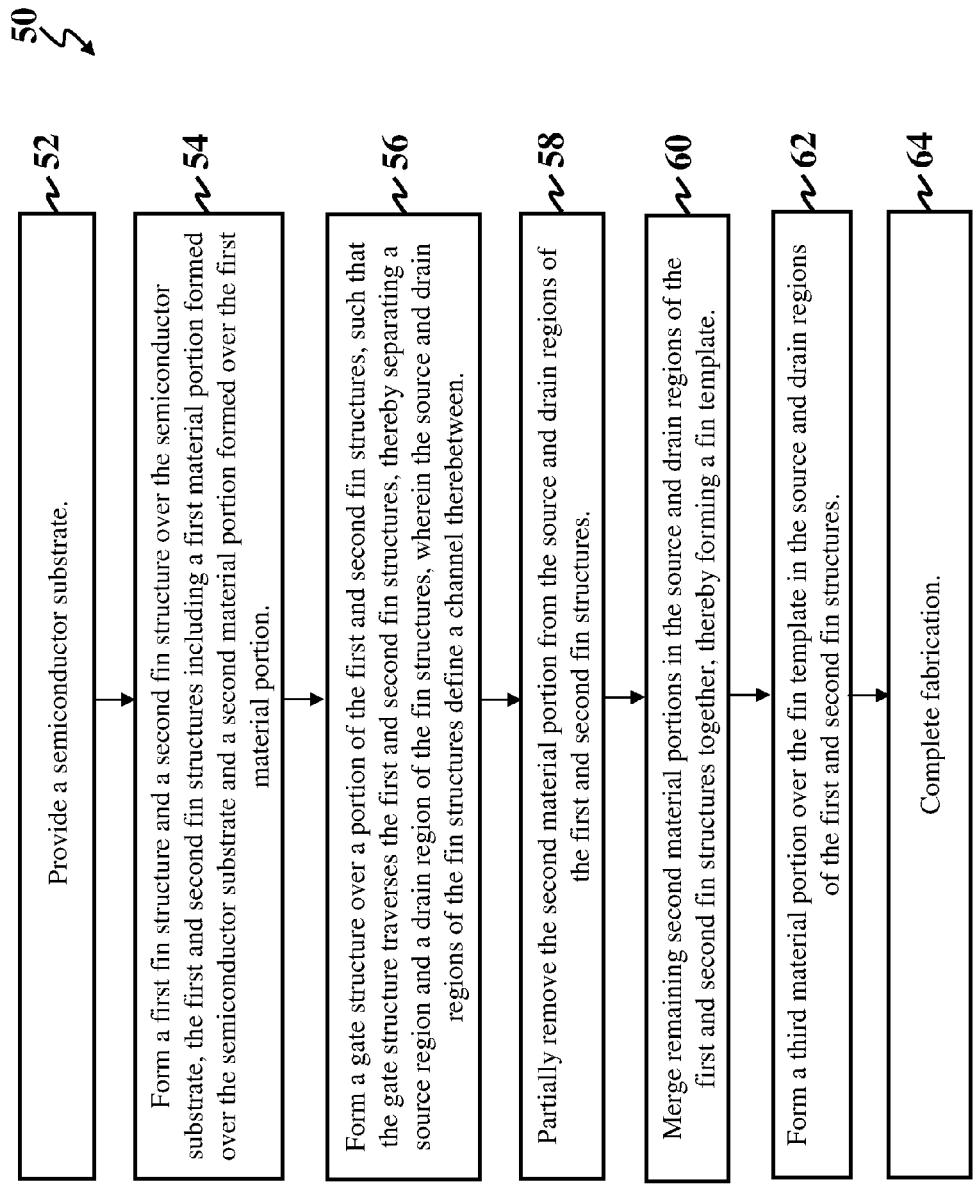
FIG. 12 is a flow chart of yet another method for fabricating a FinFET device according to aspects of the present disclosure.

FIG. 12 is a flow chart of a method 50 for fabricating an integrated circuit device according to various aspects of the present disclosure. In the depicted embodiment, the method 50 fabricates an integrated circuit device that includes a FinFET device. The method 50 begins at block 52 where a semiconductor substrate is provided. At block 54, a first fin structure and a second fin structure is formed over the semiconductor substrate. More specifically, a first material portion of the first and second fin structures is formed over the semiconductor substrate, and a second material portion of the first and second fin structures is formed over the first material portion. At block 56, a gate structure is formed over a portion of the first and second fin structures. The gate structure traverses the first and second fin structures, separating a source region and a drain region of the first and second fin structures. A channel is defined between the source and drain regions of the first and second fin structures. At block 58, the second material portion is partially removed from the source and drain regions of the first and second fin structures. At block 60, remaining second material portions in the source and drain regions of the first and second fin structures are merged together to form a fin template. At block 62, a third material portion is formed over the fin template in the source and drain regions of the first and second fin structures. The method 600 continues with block 64 where fabrication of the integrated circuit device is completed. Additional steps can be provided before, during, and after the method 50, and some of the steps described can be replaced or eliminated for other embodiments of the method.

FIGS. 13A-13C, 14A-14C, 15A-15C, and 16A-16C provide various views of a FinFET device 400, in portion or entirety, at various stages of fabrication according to the method 50 of FIG. 12. The FinFET device 400 may be included in a microprocessor, memory cell, and/or other integrated circuit device. In the depicted embodiment, the FinFET device 400 is an NMOS FinFET device. The FinFET device 400 of 13A-13C, 14A-14C, 15A-15C, and 16A-16C is similar in many respects to the FinFET device 200 of FIGS. 8A-8C, 9A-9C, 10A-10C, and 11A-11C. Accordingly, similar features in FIGS. 8A-8C, 9A-9C, 10A-10C, 11A-11C, 13A-13C, 14A-14C, 15A-15C, and 16A-16C are identified by the same reference numerals for clarity and simplicity. FIGS. 13A-13C, 14A-14C, 15A-15C, and 16A-16C have been simplified for the sake of clarity to better understand the inventive concepts of the present disclosure. Additional features can be added in the FinFET device 400, and some of the features described below can be replaced or eliminated in other embodiments of the FinFET device 400.

Figure 13A:
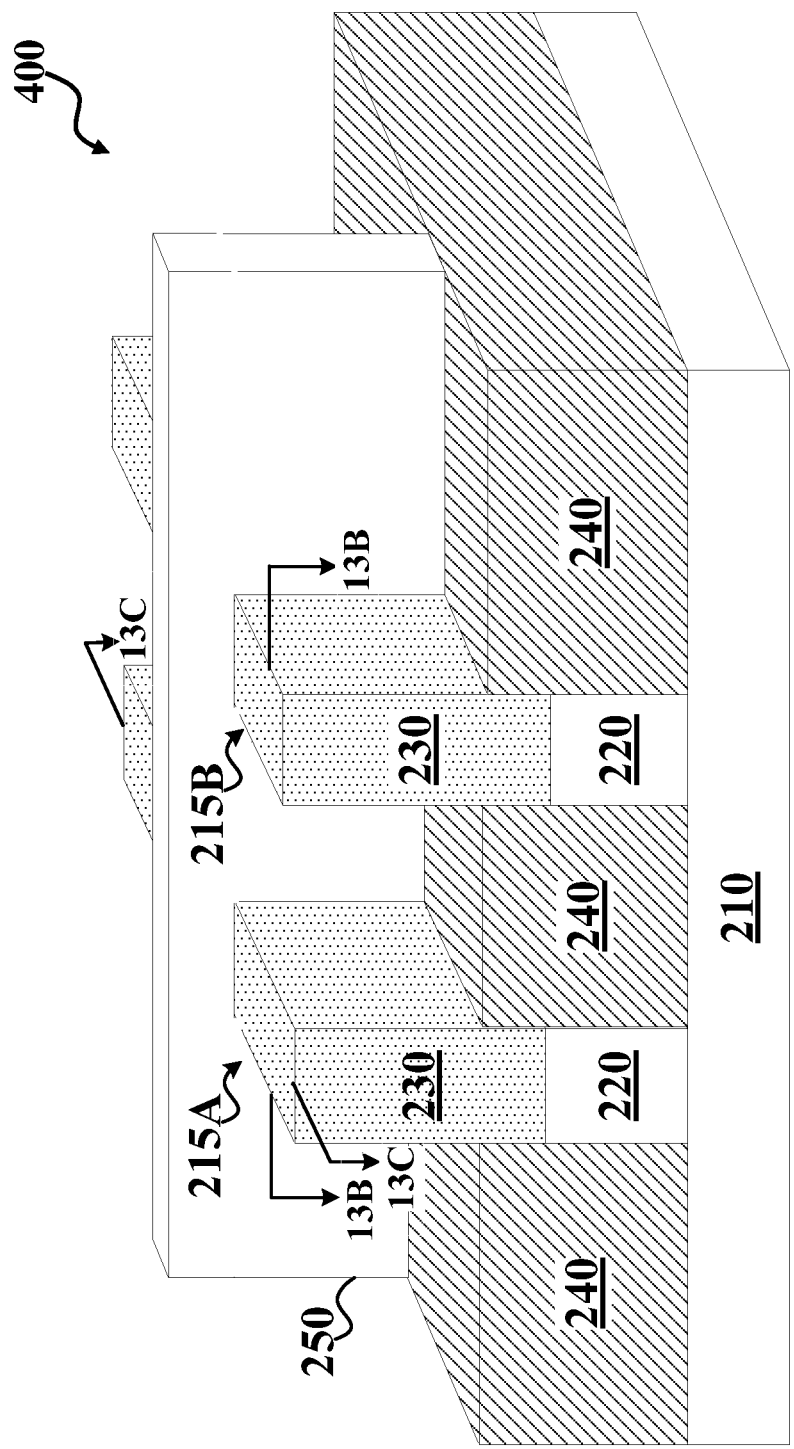
FIGS. 13A, 14A, 15A, and 16A are perspective views of a FinFET device at various fabrication stages according to the method of FIG. 12.
Figure 13B:
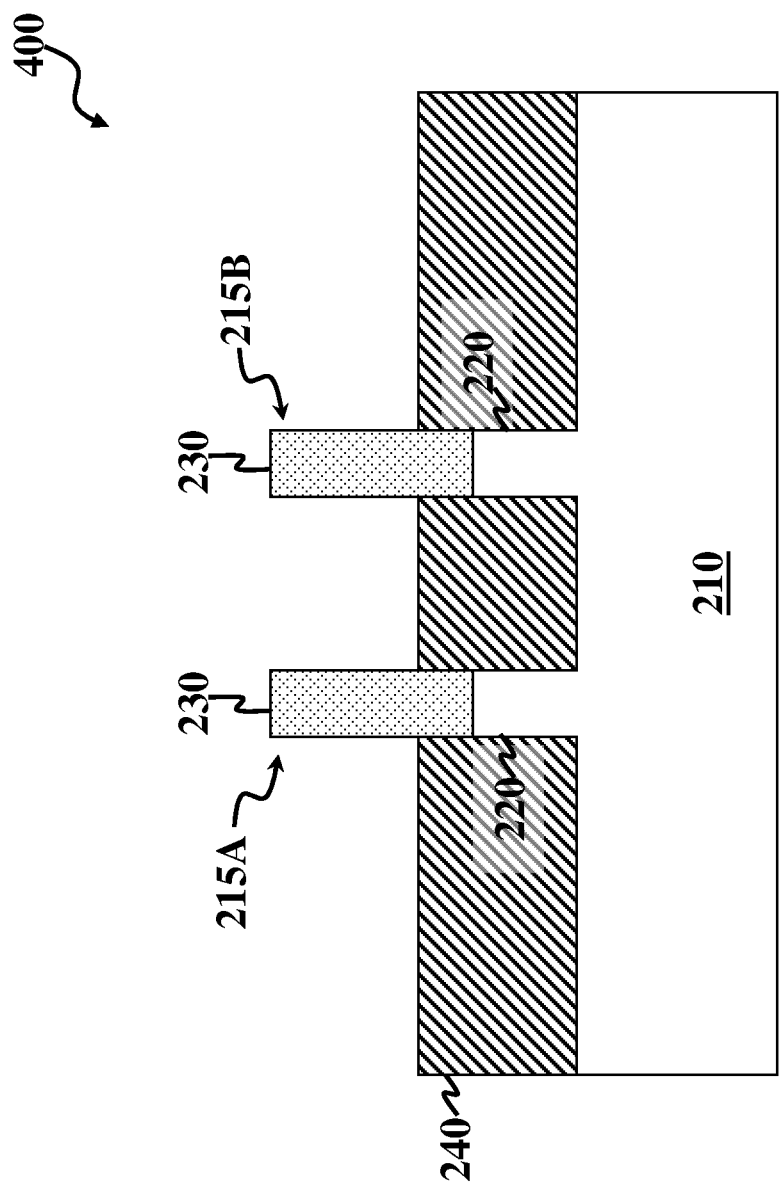
FIGS. 13B, 14B, 15B, and 16B are diagrammatic cross-sectional views of the FinFET device illustrated in FIGS. 13A, 14A, 15A, and 16A, respectively.
Figure 13C:
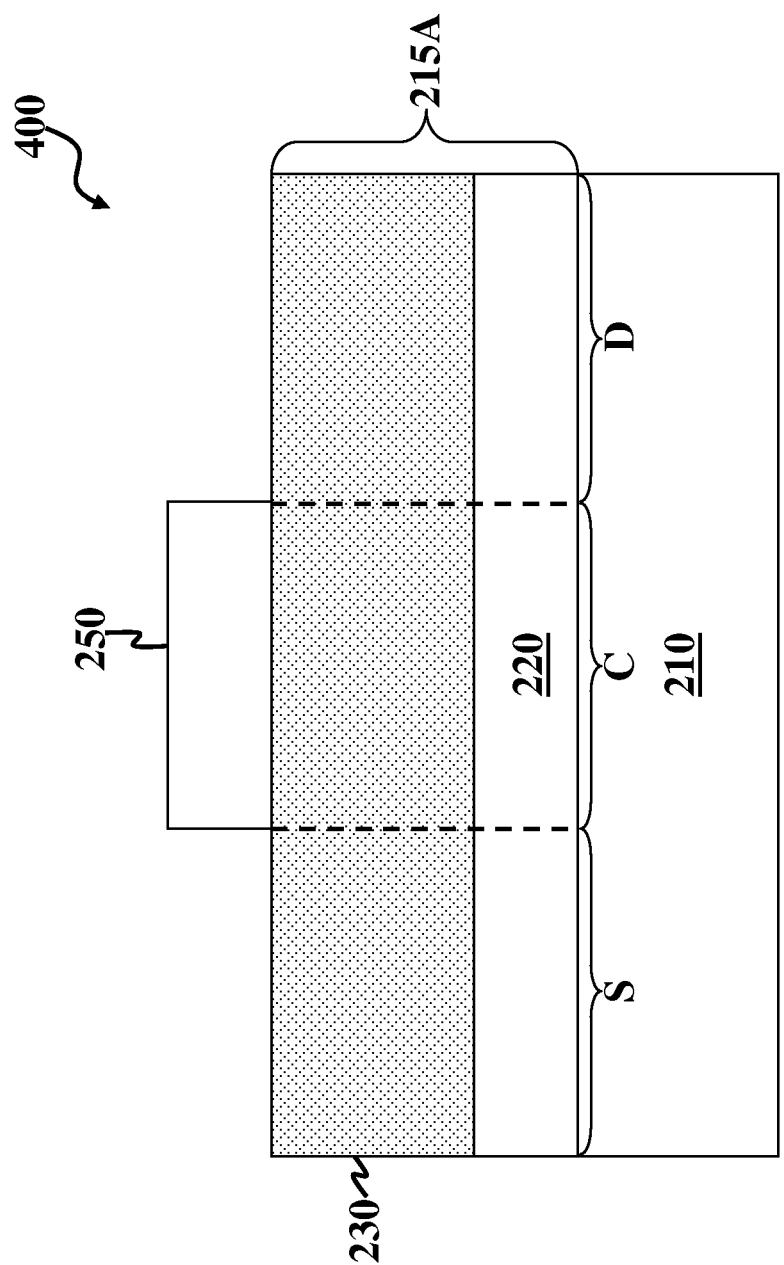
FIGS. 13C, 14C, 15C, and 16C are diagrammatic cross-sectional views of the FinFET device illustrated in FIGS. 13A, 14A, 15A, and 16A, respectively.

FIG. 13A is a perspective view of the FinFET device 400, FIG. 13B is a diagrammatic cross-sectional view of the FinFET device 400 taken along line 13B-13B in FIG. 13A, and FIG. 13C is a diagrammatic cross-sectional view of the FinFET device 400 taken along line 13C-13C in FIG. 13A. The FinFET device 400 includes the substrate 210, fin structures 215A and 215B including fin portions 220 and 230, isolation features 240, and gate structure 250. The fin structures 215A and 215B include a source region, a drain region, and a channel defined between the source and drain regions.

Figure 14A:
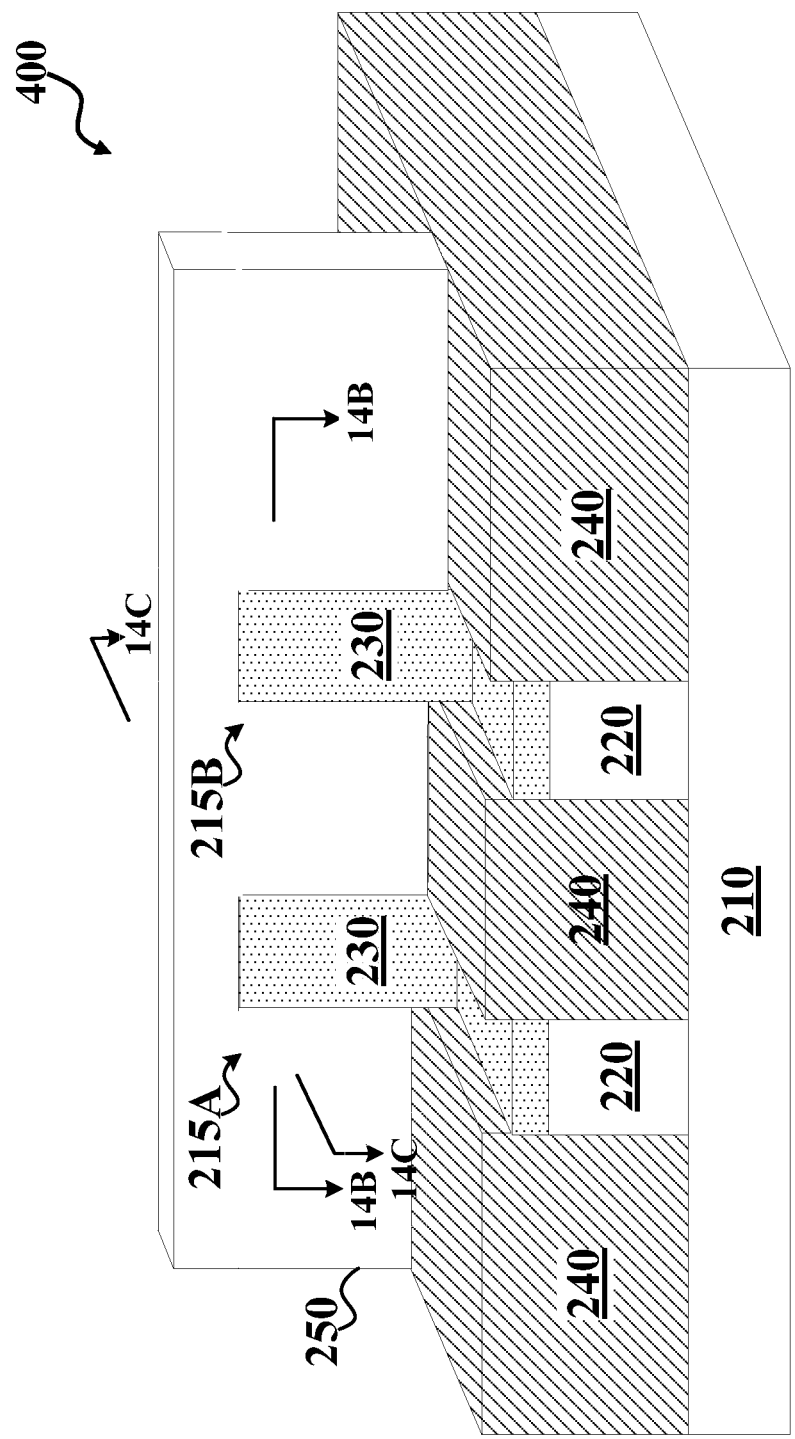
Figure 14B:
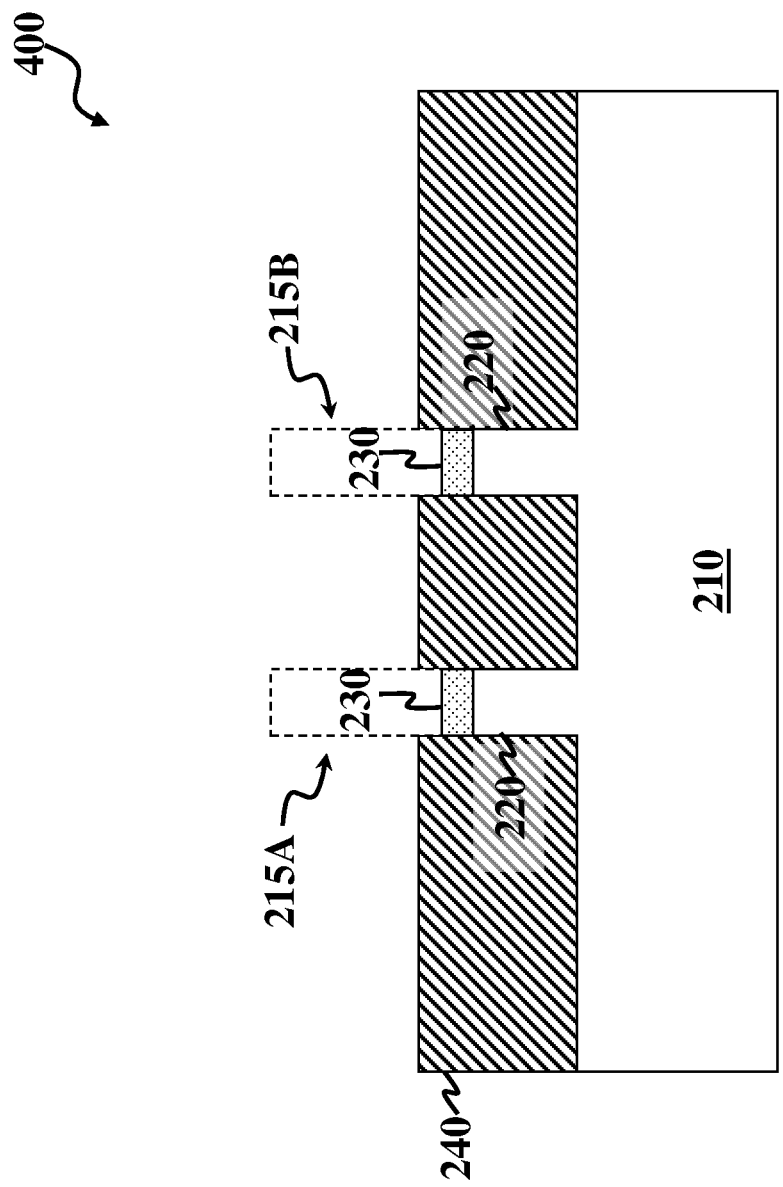
Figure 14C:
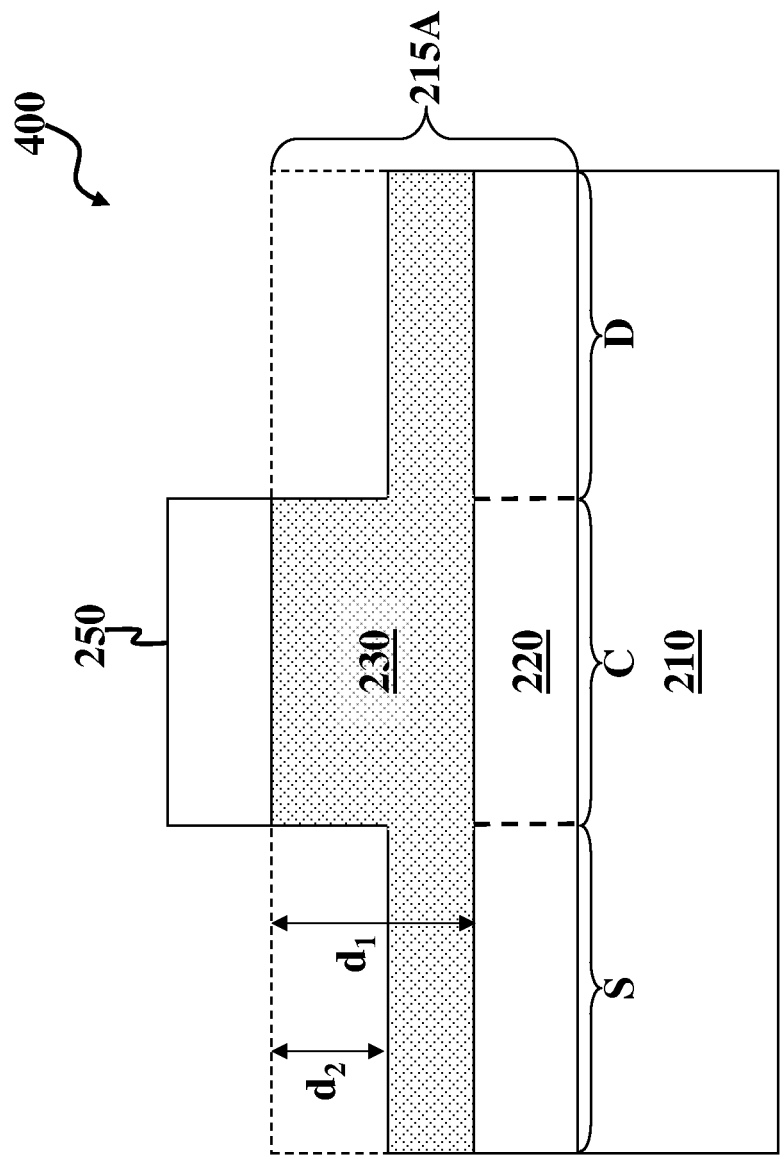

FIG. 14A is a perspective view of the FinFET device 400, FIG. 14B is a diagrammatic cross-sectional view of the FinFET device 400 taken along line 14B-14B in FIG. 14A, and FIG. 14C is a diagrammatic cross-sectional view of the FinFET device 400 taken along line 14C-14C in FIG. 14A. In FIGS. 14A-14C, the fin portion 230 is removed from the source and drain regions of the fin structures 215A and 215B. In contrast to the FinFET device 200 of FIGS. 9A-9C, in the depicted embodiment, an etching process partially removes the fin portions 230 from the source and drain regions of the fin structures 215A and 215B. Accordingly, some of the fin portions 230 remains in the source and drain regions. The etching process is a dry etching process, wet etching process, other etching process, or combinations thereof. In an example, the etching process uses a mixture of HBr, $Cl_2$, and $O_2$. Alternatively, other etching process mixtures may be used to partially remove fin portions 230. A radio frequency (RF) bias power of the etching process may be about 30 Watts (W) to about 400 W. A lithography and etching process may be implemented to provide a protective layer over various features of the FinFET device 400 (for example, the gate structure 250 and/or isolation features 240) to prevent the protected features from being affected by the etching process. As illustrated in FIG. 14C, the fin portion 230 remains in the channel of the fin structures 215A and 215B, confined by the gate structure 250, and some of the fin portions 230 remains in the source and drain regions. The removed fin portions 230 can form trenches in the source and drain regions of the fin structures 215A and 215B. The trench sidewalls may be defined by remaining fin portions 230 (in the source, drain, and channel regions), isolation features 240, and/or protective layer (if formed). In the depicted embodiment, a depth ($d_2$) of the trenches extends from an initial top surface of the fin portions 230 to a top, exposed surface of the fin portions 230. Where a protective layer is provided, $d_2$ may extend from a top surface of the protective layer to the top, exposed surface of the fin portions 230. The depth $d_1$ indicates the depth of the trenches in the source and drain regions of the FinFET device 200. Considering $d_1$ and $d_2$, the FinFET device 200 has a deeper trench (or recess) than the FinFET device 400. As will be described further below, the trench depth can be controlled to achieve various source and drain features for the fin structures, such that different kinds of channel strain can be achieved for different FinFET devices.

Figure 15A:
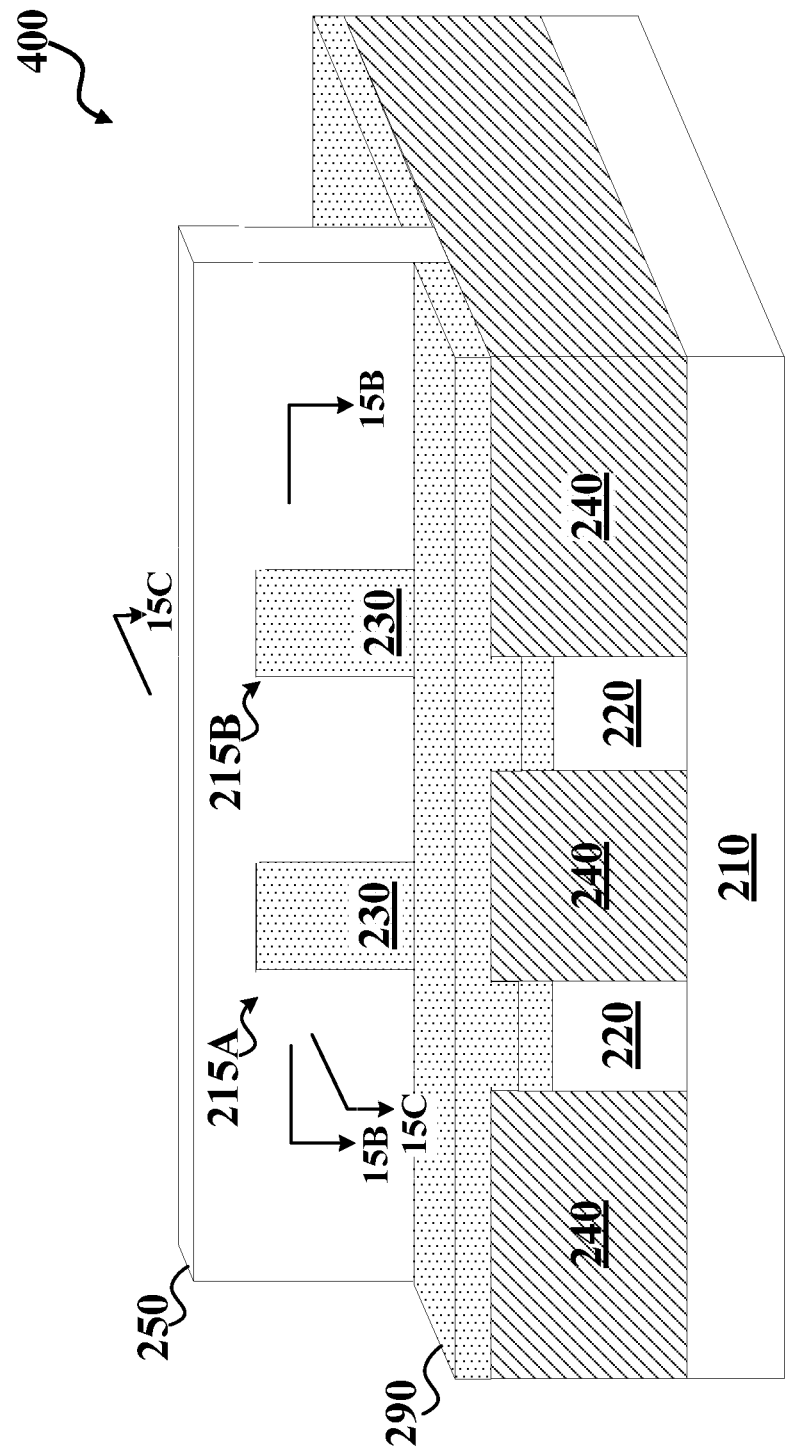
Figure 15B:
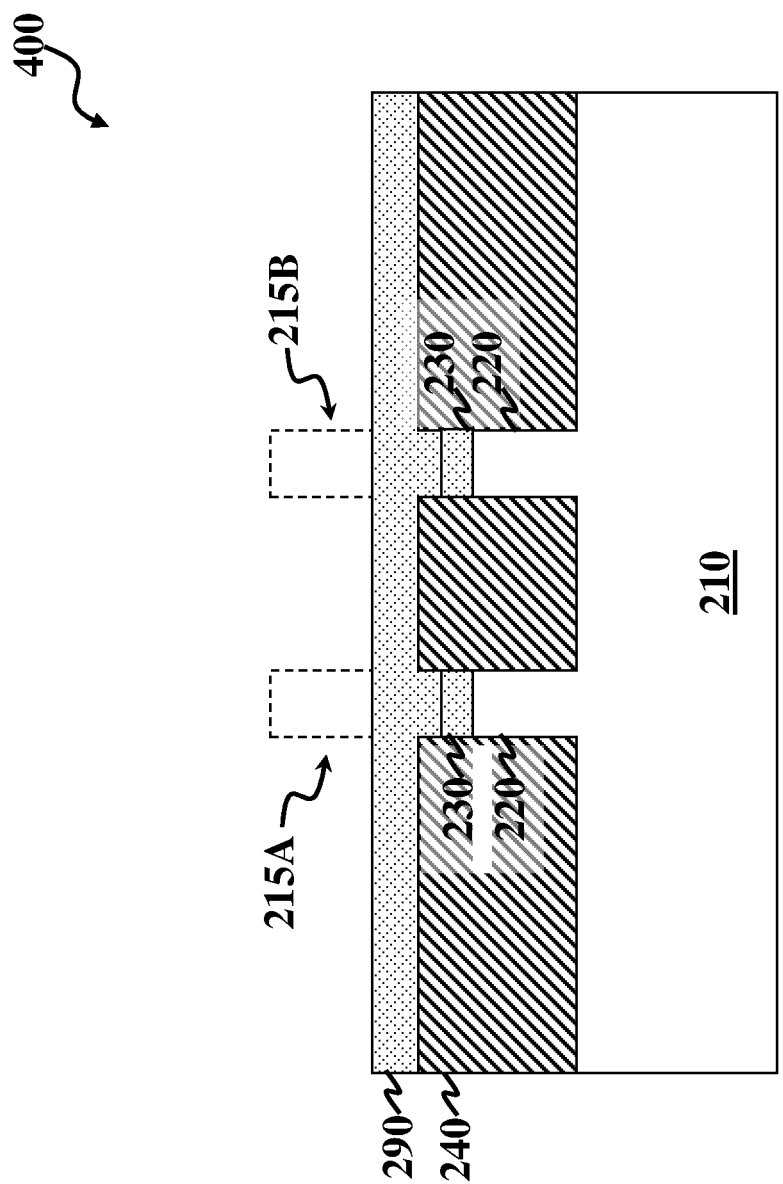
Figure 15C:
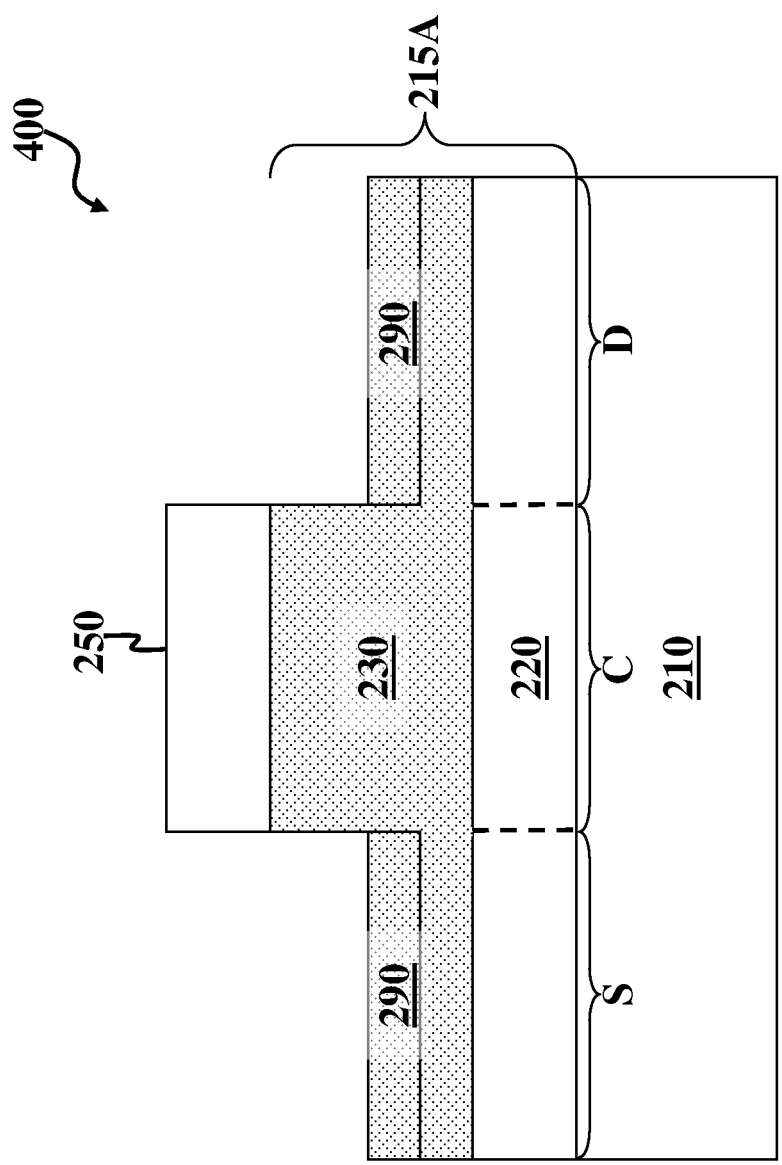

FIG. 15A is a perspective view of the FinFET device 400, FIG. 15B is a diagrammatic cross-sectional view of the FinFET device 400 taken along line 15B-15B in FIG. 15A, and FIG. 15C is a diagrammatic cross-sectional view of the FinFET device 400 taken along line 15C-15C in FIG. 15A. In FIGS. 15A-15C, the fin portions 230 remaining in the source and drain regions of the fin structures 215A and 215B are merged together to form a fin template 290. For example, the fin template 290 may be formed by a process similar to that described above with reference to FIGS. 10A-10C. In the depicted embodiment, a semiconductor material is epitaxially (epi) grown on the fin portions 230 remaining in the source and drain regions. The semiconductor material is epitaxially grown until the fin portions 230 of the fin structures 215A and 215B are merged together to form the fin template 290. Though the fin template 290 and fin portions 230 remaining in the source and drain regions are depicted separately, "fin template" may refer to the newly grown epi semiconductor material alone (depicted as fin template 290) or or the newly grown epi semiconductor material combined with the initial fin portions (depicted as fin portions 230 remaining in the source and drain regions). The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin template 290 includes silicon germanium (SiGe) formed by a silicon germanium epitaxial deposition process. Alternatively, the fin template 290 could include epitaxially grown silicon. The fin template 290 may be doped during deposition (growth) by adding impurities to the source material of the epitaxy process or subsequent to its deposition growth process by an ion implantation process. The doped epitaxial layer may have a gradient doping profile. A CMP process may be performed to planarize the fin template 290. Similar to the fin template 135 described above with reference to FIGS. 2-6, the fin template 290 can minimize stress relaxation along a width of the fin structures 215A and 215B, maximizing strain to the channels of fin structures 215A and 215B and enhancing device performance.

Figure 16A:
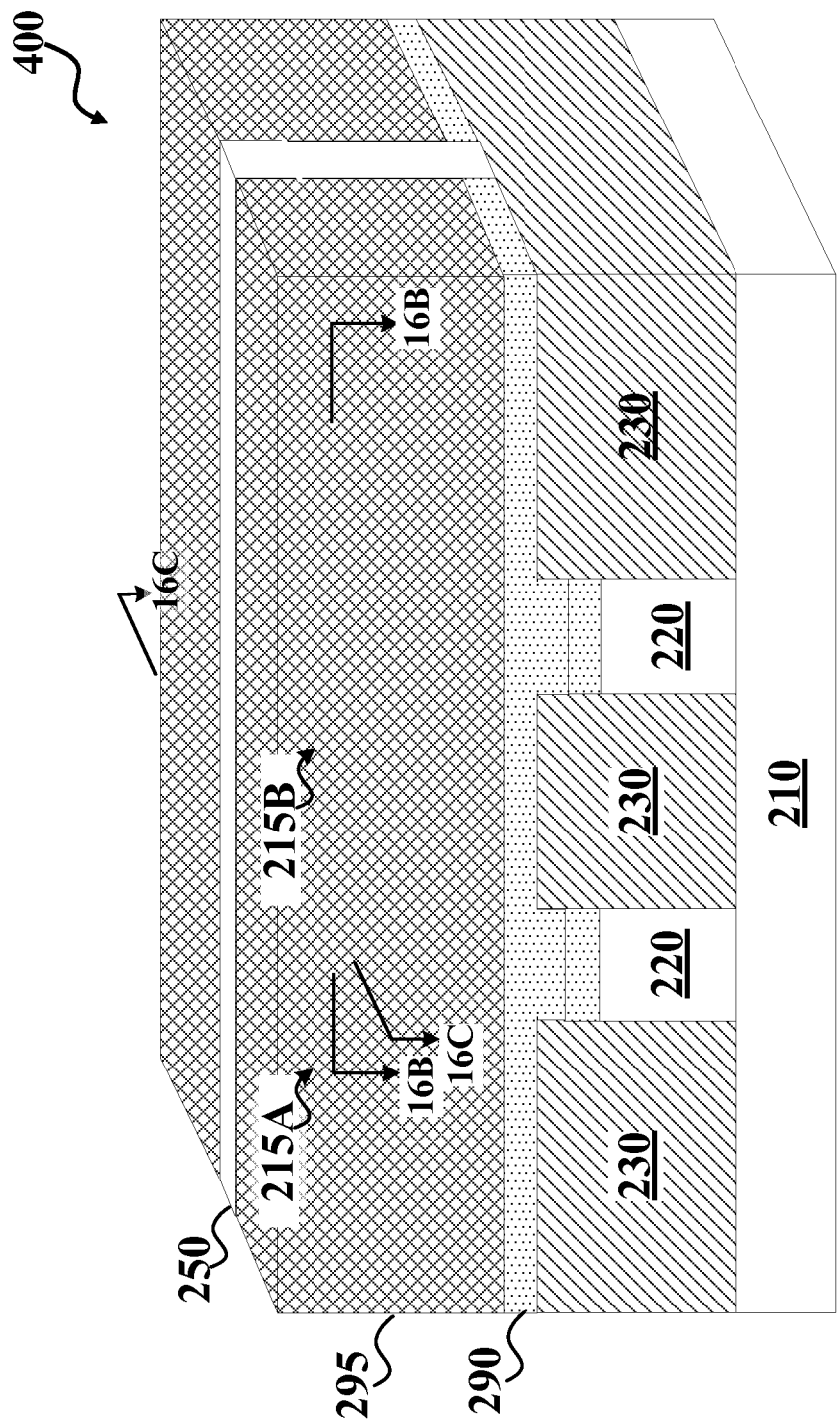
Figure 16B:
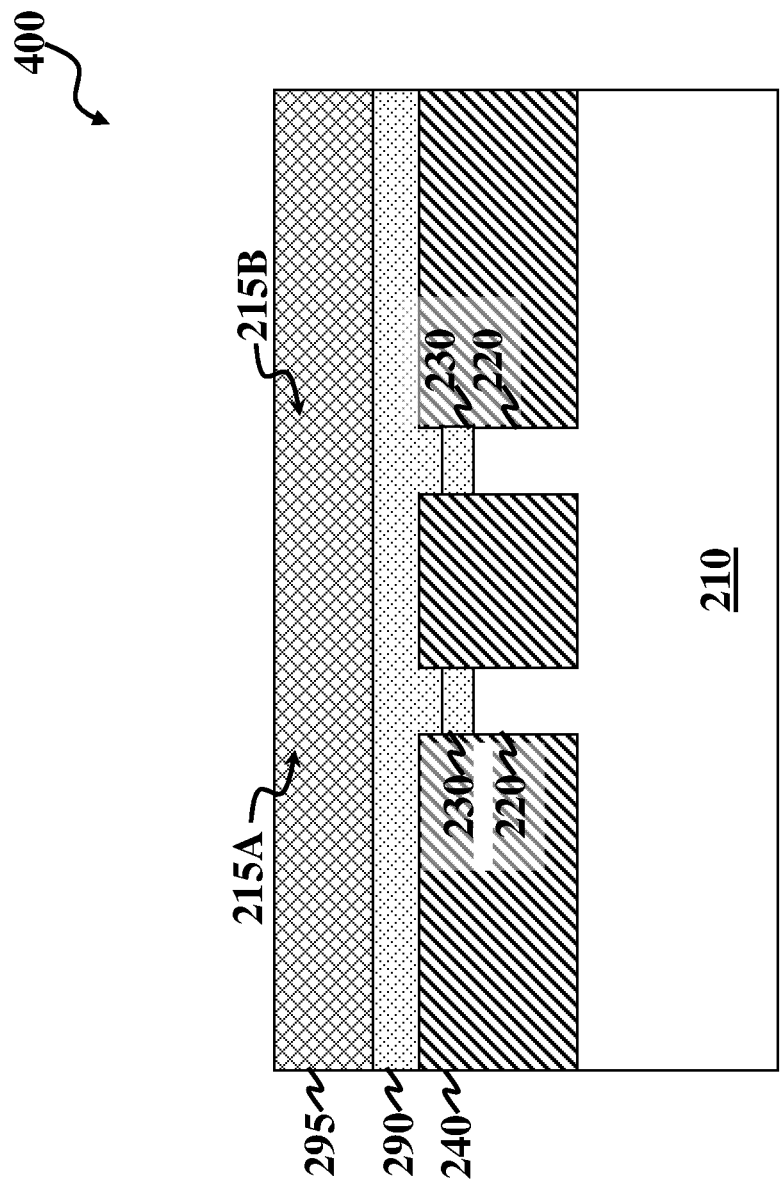
Figure 16C:
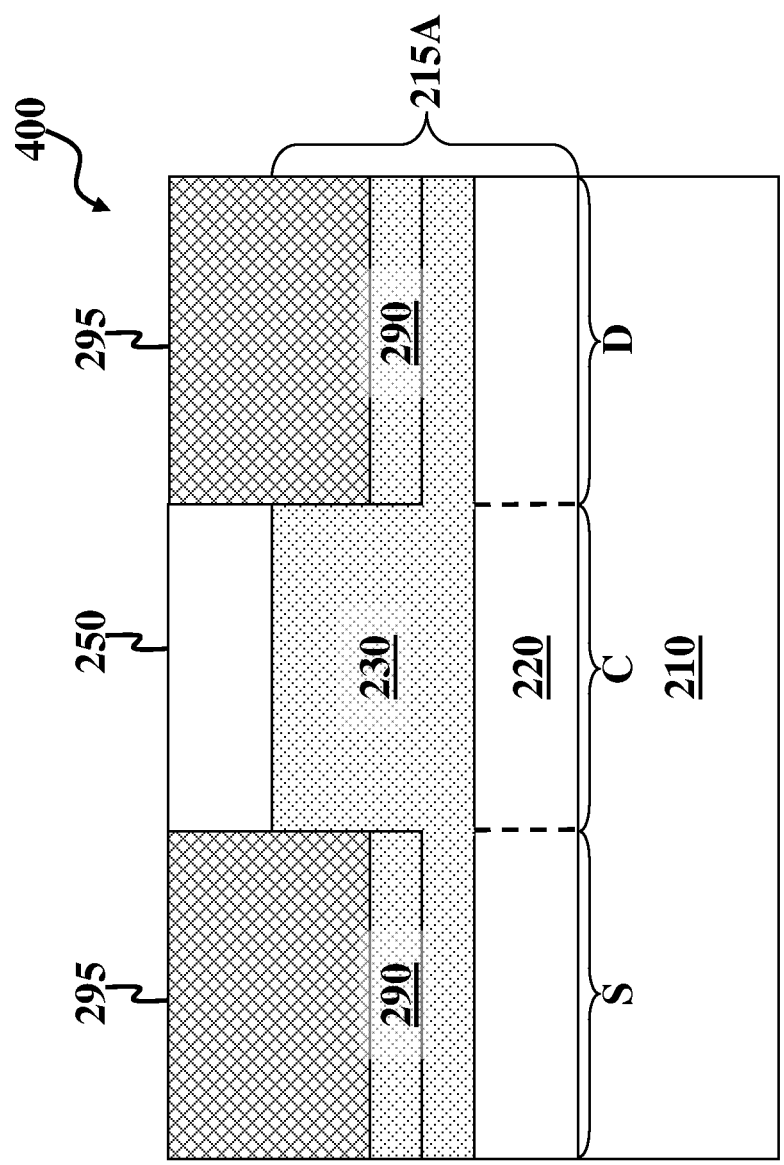

FIG. 16A is a perspective view of the FinFET device 400, FIG. 16B is a diagrammatic cross-sectional view of the FinFET device 400 taken along line 16B-16B in FIG. 16A, and FIG. 16C is a diagrammatic cross-sectional view of the FinFET device 400 taken along line 16C-16C in FIG. 16A. In FIGS. 16A-16C, a fin portion 295 is formed over the fin template 290, providing the fin structures 215A and 215B with the fin portion 295. For example, a semiconductor material is epitaxially (epi) grown on the fin template 290. The epitaxy process may use CVD deposition techniques (e.g., VPE and/or UHV-CVD), molecular beam epitaxy, and/or other suitable processes. The epitaxy process may use gaseous and/or liquid precursors. In the depicted embodiment, the fin portion 295 includes epitaxially grown SiGe. The SiGe concentration of the fin portion 295 may be represented by $Si_{1-z}Ge_z$, where z represents Ge composition in atomic percent. In the depicted embodiment, z is less than or equal to 1, and greater than or equal to 0. Alternatively, the fin portion 295 could include epitaxially grown Si. The fin portion 295 may be doped during deposition (growth) by adding impurities to the source material of the epitaxy process or subsequent to its deposition growth process by an ion implantation process. The doped epitaxial layer may have a gradient doping profile. A CMP process may be performed to planarize the fin portion 295. Further, before or after forming the fin portion 295, implantation, diffusion, and/or annealing processes may be performed to form HDD features in the source and drain regions of the fin structures 215A and 215B.

As illustrated in FIGS. 16A-16C, the fin structures 215A and 215B include fin portions 220, fin portions 230, fin template 290, and fin portions 295. More specifically, the source and drain regions of the fin structures 215A and 215B include fin portions 220, 230, 290, and 295. The channel of the fin structures 215A and 215B includes fin portions 220 and 230. The fin portions 230, 290, and/or 295 in the source and drain regions are alternatively referred to as strained source and drain features of the FinFET device 400. In the depicted embodiment, fin portions 220 include Si, fin portions 230 and 290 include $Si_{1-x}Ge_x$, and fin portions 295 include $Si_{1-z}Ge_z$, where z is less than x. The fin portions 230, 290, and 295 provide tensile stress to the channel of the fins structures 215A and 215B, enhancing electron mobility in the channel of the NMOS FinFET device 400.

The FinFET device 400 may include additional features, which may be formed by subsequent processing. For example, silicide features may be formed in the source and drain regions of the fin structures 215A and 215B, specifically on fin portions 295. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 400. The additional features may provide electrical interconnection to the device 400 including the gate structure 250. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Thus, the present disclosure provides integrated circuit devices that can exhibit maximized strain to their channels, and methods for fabricating the integrated circuit devices with maximized strain. Maximized strain can be achieved by incorporating a fin template in the integrated circuit devices. It is understood that different embodiments may have different advantages, and that no particular advantage is necessarily required of any embodiment. It should also be noted that the FinFET device 100, PMOS FinFET device 200, and/or NMOS FinFET device 400 can be fabricated in a single integrated circuit device using the methods 10, 30, and 50 described above. Referring to FinFET devices 200 and 400, by controlling source and drain trench depth (for example, $d_1$ and $d_2$) for the epi source and drain features, strain for both PMOS and NMOS FinFET devices can be achieved and optimized. For example, as described above, fin portions 230 are completely removed from the source and drain regions of the fin structures 215A and 215B in FinFET device 200, yet are partially removed from the source and drain regions of the fin structures 215A and 215B in FinFET device 400. This provides different starting substrates for forming the fin templates, such that different types of strain can be achieved. Accordingly, the trench depth can be tuned to independently optimize performance of each FinFET device in an integrated circuit device. Further, the fin templates in the PMOS and NMOS FinFET devices can minimize stress relaxation along a width of the fin structures.

The present disclosure provides for many different embodiments. For example, the present disclosure provides methods for fabricating an integrated circuit device. In an embodiment, a method includes providing a semiconductor substrate; forming a plurality of fins over the semiconductor substrate, the fins being isolated from each other by an isolation structure; forming a gate structure over a portion of each fin, such that the gate structure traverses the plurality of fins; forming a fin template on exposed portions of the fins; and epitaxially (epi) growing a semiconductor material over the fin template. Forming the fin template can include epitaxially growing another semiconductor material on exposed portions of each of the fins, such that the fins are merged together. The method can further include etching back the isolation structure before forming the fin template. The method can further include forming spacers on sidewalls of the gate structure. The etching back of the isolation structure may use an etching process that selectively etches the isolation structure. In an example, epitaxially growing the semiconductor material on exposed portions of the fins includes epitaxially growing silicon, and epitaxially growing the semiconductor material over the fin template includes eptiaxially growing silicon germanium.

The method may further include etching back the fin template before epitaxially growing the semiconductor material over the fin template. In an example, the gate structure separates a source region and a drain region of each of the fins, wherein a channel is defined between the source and drain regions of each fin. Etching back the fin template may include exposing a portion of the channel of each of the fins. In an example, forming the plurality of fins includes forming the fins having a first material portion and a second material portion, each of the fins including a source region and a drain region separated by the gate structure, wherein the source and drain regions of each fin define a channel therebetween. The method may include completely removing the second material portion from the source and drain regions of the fins before forming the fin template and/or partially removing the second material portion from the source and drain regions of the fins before forming the fin template.

In another embodiment, a method includes providing a semiconductor substrate; forming a first fin structure and a second fin structure over the semiconductor substrate; forming a gate structure over a portion of the first and second fin structures, such that the gate structure traverses the first and second fin structures; epitaxially growing a first semiconductor material on exposed portions of the first and second fin structures, such that the exposed portions of the first and second fin structures are merged together; and epitaxially growing a second semiconductor material over the first semiconductor material. The method may further include forming an isolation structure between the first and second fin structures, such that the first and second fin structures are isolated from one another, and etching back the isolation structure before epitaxially growing the first semiconductor material. The method may include etching back the first semiconductor material before epitaxially growing the second semiconductor material. In an example, the epitaxially growing the first semiconductor material includes epitaxially growing silicon, and the epitaxially growing the second semiconductor material includes epitaxially growing silicon germanium. The method may include removing a portion of the first and second fin structures before epitaxially growing the first semiconductor material. In an example, the first and second fins include a first material portion and a second material portion, the first and second fins each have a source region and a drain region separated by the gate structure, and the source and drain regions of each fin defining a channel therebetween. In this example, removing the portion of the first and second fins may include completely removing the second material portion from the source and drain regions of the first and second fins and/or partially removing the second material portion from the source and drain regions of the first and second fins.

An integrated circuit device is formed by the methods described herein. In an embodiment, the integrated circuit device includes a semiconductor substrate; a first fin and a second fin disposed over the semiconductor substrate; an isolation structure disposed between the first and second fins, such that the first and second fins are isolated from each other; a gate structure disposed over a portion of the first and second fins, the gate structure traversing the first and second fins, thereby separating a source region and a drain region of the first and second fins; a first epitaxial semiconductor layer disposed over another portion of the first and second fins; and a second epitaxial semiconductor layer disposed over the first epitaxial semiconductor layer, wherein the source and drain regions of the first and second fins include a portion of the first and second epitaxial semiconductor layers. The source and drain regions of each of the first and second fins defines a channel therebetween. The channel may be in contact with the first and second epitaxial semiconductor layers. In an example, the first and second fins include silicon, the first epitaxial semiconductor layer includes silicon, and the second epitaxial semiconductor layer includes silicon germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FinFET device, the method comprising:
   providing a semiconductor substrate;
   forming a first fin structure and a second fin structure over the semiconductor substrate;
   forming a gate structure over a portion of the first and second fin structures, such that the gate structure traverses the first and second fin structures;
   epitaxially growing a first semiconductor material on exposed portions of the first and second fin structures, such that the exposed portions of the first and second fin structures are merged together;
   etching back the first semiconductor material; and
   epitaxially growing a second semiconductor material over the fin semiconductor material after etching back the first semiconductor material.

2. The method of claim 1 further including:
   forming an isolation structure between the first and second fin structures, such that the first and second fin structures are isolated from one another; and
   etching back the isolation structure before epitaxially growing the first semiconductor material.

3. The method of claim 1 wherein:
   the epitaxially growing the first semiconductor material includes epitaxially growing silicon; and
   the epitaxially growing the second semiconductor material includes epitaxially growing silicon germanium.

4. A method comprising:
   providing a semiconductor substrate;
   forming a gate structure over a portion of the first and second fin structures, such that the gate structure traverses the first and second fin structures;
   epitaxially growing a first semiconductor material on exposed portions of the first and second fin structures, such that the exposed portions of the first and second fin structures are merged together, wherein the epitaxially growing the first semiconductor material includes epitaxially growing silicon;
   epitaxially growing a second semiconductor material over the first semiconductor material, wherein the epitaxially growing the second semiconductor material includes epitaxially growing silicon germanium; and
   etching back the first semiconductor material before epitaxially growing the second semiconductor material.

5. The method of claim 4 further including:
   forming an isolation structure between the first and second fin structures, such that the first and second fin structures are isolated from one another; and
   etching back the isolation structure before epitaxially growing the first semiconductor material.

6. The method of claim 4, further comprising forming an isolation structure over the substrate such that the isolation structure extends from the first fin structure to the second fin structure; and
   after forming the gate structure, recessing the isolation structure by removing a portion of the isolation structure, and
   wherein epitaxially growing the first semiconductor material on exposed portions of the first and second fin structures includes epitaxially growing the first semiconductor material over the recessed isolation structure.

7. The method of claim 4, wherein etching back the first semiconductor material before epitaxially growing the second semiconductor material includes removing a portion of the first and second fin structures.

8. The method of claim 4 further including removing a portion of the first and second fin structures before epitaxially growing the first semiconductor material.

9. The method of claim 8 wherein:
   the first and second fins include a first material portion and a second material portion, the first and second fins each having a source region and a drain region separated by the gate structure, the source and drain regions of each fin defining a channel therebetween; and
   the removing the portion of the first and second fins includes partially removing the second material portion from the source and drain regions of the first and second fins.

10. The method of claim 8 wherein:
    the first and second fins include a first material portion and a second material portion, the first and second fins each having a source region and a drain region separated by the gate structure, the source and drain regions of each fin defining a channel therebetween; and
    the removing the portion of the first and second fins includes partially removing the second material portion from the source and drain regions of the first and second fins.

11. A method comprising:
   providing a semiconductor substrate;
   forming a plurality of fins over the semiconductor substrate, the fins being isolated from each other by isolation structure;
   forming a gate structure over a portion of each fin, such that the gate structure traverses the plurality of fins;
   after forming the gate structure, recessing the isolation structure by removing a portion of the isolation structure;
   forming a fin template on exposed portions of the fins and the recessed isolation structure; and
   epitaxially growing a semiconductor material over the fin template.

12. The method claim 11 wherein the forming the fin template includes epitaxially growing another semiconductor material on exposed portions of each of the fins, such that the fins are merged together.

13. The method of claim 11, further comprising forming spacers on sidewalls of the gate structure.

14. The method of claim 11 further including etching back the fin template before epitaxially growing the semiconductor material over the fin template.

15. The method of claim 14 wherein:
   the gate structure separates a source region and a drain region of each of the fins, the source and drain regions of each fin defining a channel therebetween; and
   the etching back the fin template includes exposing a portion of the channel of each of the fins.

16. The method of claim 11, wherein forming the fin template on exposed portions of the fins and the recessed isolation structure includes epitaxially growing another semiconductor material on exposed portions of the fins and the recessed isolation structure.

17. The method of claim 16, wherein the another semiconductor material includes silicon, and
   wherein the semiconductor material include silicon germanium.

18. The method of claim 11 wherein the forming the plurality of fins includes forming the fins having a first material portion and a second material portion, each of the fins including a source region and a drain region separated by the gate structure, the source and drain regions of each fin defining a channel therebetween.

19. The method of claim 18 further including completely removing the second material portion from the source and drain regions of the fins before forming the fin template.

20. The method of claim 18 further including partially removing the second material portion from the source and drain regions of the fins before forming the fin template.

* * * * *